US009640689B2

(12) United States Patent
Hamamoto et al.

(10) Patent No.: US 9,640,689 B2
(45) Date of Patent: May 2, 2017

(54) POLYESTER FILM FOR THE PROTECTION OF BACK SURFACES OF SOLAR CELLS

(75) Inventors: Shiro Hamamoto, Tsuruga (JP); Yoshitomo Ikehata, Tsuruga (JP); Katsuya Ito, Tsuruga (JP); Jun Inagaki, Tsuruga (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 109 days.

(21) Appl. No.: 13/499,595

(22) PCT Filed: Aug. 30, 2010

(86) PCT No.: PCT/JP2010/064669
§ 371 (c)(1),
(2), (4) Date: Mar. 30, 2012

(87) PCT Pub. No.: WO2011/040161
PCT Pub. Date: Apr. 7, 2011

(65) Prior Publication Data
US 2012/0183761 A1 Jul. 19, 2012

(30) Foreign Application Priority Data

Sep. 30, 2009 (JP) ................................. 2009-226779
Jun. 16, 2010 (JP) ................................. 2010-137317

(51) Int. Cl.
| B32B 27/36 | (2006.01) |
| C08L 67/02 | (2006.01) |
| C08K 3/22 | (2006.01) |
| B32B 5/18 | (2006.01) |
| H01L 31/048 | (2014.01) |
| B32B 27/20 | (2006.01) |
| C08G 63/82 | (2006.01) |
| C08G 63/84 | (2006.01) |

(52) U.S. Cl.
CPC .......... *H01L 31/048* (2013.01); *B32B 27/205* (2013.01); *B32B 27/36* (2013.01); *C08G 63/826* (2013.01); *C08G 63/84* (2013.01); *C08L 67/02* (2013.01); *B32B 2264/02* (2013.01); *B32B 2264/102* (2013.01); *B32B 2307/416* (2013.01); *Y02E 10/50* (2013.01); *Y02E 10/52* (2013.01); *Y10T 428/249981* (2015.04); *Y10T 428/249986* (2015.04)

(58) Field of Classification Search
CPC ..... C08G 63/826; C08G 63/84; H01L 31/042; H01L 31/048; Y02E 10/52; B32B 27/065; B32B 27/205; B32B 27/36; B32B 2264/02; B32B 2264/10; B32B 2307/416; B32B 2307/306
USPC .................... 428/316.6, 317.9; 524/605, 497
See application file for complete search history.

(56) References Cited

U.S. PATENT DOCUMENTS

| 7,132,383 | B2 | 11/2006 | Nakajima et al. | |
| 8,062,740 | B2 | 11/2011 | Nishi et al. | |
| 8,507,791 | B2 | 8/2013 | Suzuta et al. | |
| 2001/0036545 | A1 | 11/2001 | Nishi et al. | |
| 2003/0083191 | A1* | 5/2003 | Nakajima et al. | 502/100 |
| 2004/0058805 | A1 | 3/2004 | Nakajima et al. | |
| 2004/0266930 | A1 | 12/2004 | Nishi et al. | |
| 2006/0286363 | A1 | 12/2006 | Nishi et al. | |
| 2008/0076863 | A1 | 3/2008 | Honma et al. | |
| 2008/0254259 | A1 | 10/2008 | Nishi et al. | |
| 2008/0311385 | A1* | 12/2008 | Miyazaki et al. | 428/330 |
| 2009/0042016 | A1* | 2/2009 | Yoshida | B32B 3/26 428/317.9 |
| 2010/0143699 | A1* | 6/2010 | Aoyama et al. | 428/319.7 |
| 2010/0229945 | A1 | 9/2010 | Suzuta et al. | |
| 2011/0045288 | A1 | 2/2011 | Koda et al. | |

FOREIGN PATENT DOCUMENTS

| CN | 101029126 A | 9/2007 |
| EP | 1 142 937 A2 | 10/2001 |
| JP | 60-250946 A | 12/1985 |
| JP | 06-038264 U | 5/1994 |
| JP | H10-204266 A | 8/1998 |
| JP | 2001-089590 A | 4/2001 |
| JP | 2002-026354 A | 1/2002 |
| JP | 2002-134771 A | 5/2002 |
| JP | 2002-220449 A | 9/2002 |

(Continued)

OTHER PUBLICATIONS

Translation of JP 2002-026354, Mayaji et al., Jan. 25, 2002, 17 pages.*
Japanese Patent Office, Office Action in Japanese Patent Application No. 2010-137317 (Nov. 16, 2010).
Japanese Patent Office, Office Action in Japanese Patent Application No. 2010-137317 (Feb. 8, 2011).
Japanese Patent Office, International Search Report in International Patent Application PCT/JP2010/064669 (Nov. 22, 2010).

(Continued)

*Primary Examiner* — Hai Vo
(74) *Attorney, Agent, or Firm* — Leydig, Voit & Mayer, Ltd.

(57) ABSTRACT

The invention provides a polyester film for the protection of a back surface of a solar cell which, when applied to a silicon thin film solar cell, exhibits excellent durability even under high-temperature and high-humidity conditions and long term thermal stability. The polyester film (a) contains a polyester, as a main constituent, obtained by polymerization using a polycondensation catalyst containing aluminum and/or its compound as well as a phosphorus compound having an aromatic group in the molecule; (b) has a whiteness degree of 50 or higher; (c) contains 3 to 50% by mass of fine particles with a mean particle diameter of 0.1 to 3 μm; and (d) has an acid value from not lower than 1 (eq/ton) and not higher than 30 (eq/ton).

13 Claims, No Drawings

(56) References Cited

FOREIGN PATENT DOCUMENTS

| | | | |
|---|---|---|---|
| JP | 2002-249564 A | 9/2002 | |
| JP | 2003-060218 A | 2/2003 | |
| JP | 2004-247390 A | 9/2004 | |
| JP | 2005-152013 A | 6/2005 | |
| JP | 2005-322687 A | 11/2005 | |
| JP | 2006-016603 A | 1/2006 | |
| JP | 2006-282801 A | 10/2006 | |
| JP | 2007-118267 A | 5/2007 | |
| JP | 2007-136911 A1 | 6/2007 | |
| JP | 2007-204538 A | 8/2007 | |
| JP | 2007-208179 A | 8/2007 | |
| JP | 2007-262411 A | 10/2007 | |
| JP | 2008-004839 A | 1/2008 | |
| JP | 2008-085270 A | 4/2008 | |
| JP | 2008-166338 A | 7/2008 | |
| JP | 2008-218856 A | 9/2008 | |
| JP | 2008-230018 A | 10/2008 | |
| JP | 2008-231399 A | 10/2008 | |
| JP | 2008-255321 A | 10/2008 | |
| JP | 2008-266359 A | 11/2008 | |
| JP | 2009-052043 A | 3/2009 | |
| JP | 2009-144021 A | 7/2009 | |
| JP | 2009-149066 A | 7/2009 | |
| JP | 2009-209233 A | 9/2009 | |
| JP | 2009-220376 A | 10/2009 | |
| JP | 2010-003900 A | 1/2010 | |
| WO | WO 2002-022707 A1 | 3/2002 | |
| WO | WO 2007-148754 A | 12/2007 | |
| WO | WO 2008/149757 A1 | 12/2008 | |
| WO | WO 2008149757 A1 * | 12/2008 | |

OTHER PUBLICATIONS

Taiwanese Patent Office, Notification for the Opinion of Examination in Taiwanese Patent Application No. 099132921 (May 27, 2013).

Korean Patent Office, Notice of Preliminary Rejection in Korean Patent Application No. 10-2012-7009705 (May 20, 2016).

Japanese Patent Office, Notification of Reasons for Rejection in Japanese Patent Application No. 2009-001489 (Apr. 1, 2010).

Japanese Patent Office, Notification of Reasons for Rejection in Japanese Patent Application No. 2009-001489 (Dec. 7, 2010).

Japanese Patent Office, Decision of Rejection in Japanese Patent Application No. 2009-001489 (Apr. 3, 2012).

Japanese Patent Office, Notification of Reasons for Rejection in Japanese Patent Application No. 2009-002369 (Jul. 30, 2013).

Japanese Patent Office, Notification of Reasons for Rejection in Japanese Patent Application No. 2009-053354 (Apr. 8, 2010).

Japanese Patent Office, Notification of Reasons for Rejection in Japanese Patent Application No. 2009-053354 (Dec. 14, 2010).

Japanese Patent Office, Decision of Rejection in Japanese Patent Application No. 2009-053354 (Feb. 21, 2012).

Japanese Patent Office, Pretrial Report in Japanese Patent Application No. 2009-053354 (Sep. 26, 2012).

Japanese Patent Office, Notification of Reasons for Rejection in Japanese Patent Application No. 2009-182049 (May 28, 2013).

Japanese Patent Office, Notification of Reasons for Rejection in Japanese Patent Application No. 2009-182049 (Aug. 6, 2013).

Japanese Patent Office, Notification of Reasons for Rejection in Japanese Patent Application No. 2010-000519 (Jul. 30, 2013).

Japanese Patent Office, Notification of Reasons for Rejection in Japanese Patent Application No. 2010-182898 (Sep. 14, 2010).

Japanese Patent Office, Notification of Reasons for Rejection in Japanese Patent Application No. 2010-182898 (Dec. 7, 2010).

Japanese Patent Office, Notification of Reasons for Rejection in Japanese Patent Application No. 2012-144012 (Jul. 30, 2013).

European Patent Office, Extended European Patent Search Report in European Patent Application No. 10820281.3 (Oct. 22, 2014).

Chinese Patent Office, Third Office Action in Chinese Patent Application No. 201080043777.6 (Jan. 13, 2015).

Chinese Patent Office, Second Office Action in Chinese Patent Application No. 201080043777.6 (Jun. 24, 2014).

Korean Patent Office, Notice of Preliminary Rejection in Korean Patent Application No. 10-2012-7009705 (Dec. 26, 2016).

* cited by examiner

POLYESTER FILM FOR THE PROTECTION OF BACK SURFACES OF SOLAR CELLS

TECHNICAL FIELD

The present invention relates to a polyester film for the protection of a back surface of a solar cell.

BACKGROUND ART

A solar cell which can obtain electric power by using energy not derived from petroleum fuels has been more desired in terms of environmental preservation. As described in, for example, Japanese Utility Model Application Laid-Open (JP-U) No. 6-38264, a solar cell module generally has a structure formed by sandwiching a plurality of plate-like solar cell elements between a glass substrate in the light-receiving side and a back surface protection film and filling the inside gap with a sealing resin.

A plastic film having excellent mechanical properties, heat resistance, and moisture resistance is used as the back surface protection film. A back surface protection film using a polyethylene terephthalate film is proposed in, for example, Japanese Patent Application Publication Laid-Open (JP-A) Nos. 2002-26354 and 2003-60218. As described in the following Patent Documents, a white-color back surface protection film is sometimes used in order to increase power generation efficiency of solar cells.

PRIOR ART DOCUMENTS

Patent Documents

Patent Document 1: JP-A No. 2002-26354
Patent Document 2: JP-A No. 2003-60218
Patent Document 3: JP-A No. Sho 60-250946
Patent Document 4: JP-A No. 2004-247390
Patent Document 5: JP-A No. 2002-134771
Patent Document 6: JP-A No. 2007-208179
Patent Document 7: JP-A No. 2008-85270
Patent Document 8: JP-A No. 2008-4839

SUMMARY OF THE INVENTION

Problems to be Solved by the Invention

As described above, sunlight is reflected and the power generation efficiency can be increased by using a white polyester film. To obtain a white polyester film, it is required to add a large quantity of particles to a polyester substrate. Therefore, there is the following problem that in order to improve their dispersibility, a raw material is produced by previously mixing two or more kinds of materials and mixing state and a melting time is prolonged in a common extrusion step and accordingly, heat history is repeated so many times as to deteriorate the resin and it results in a problem that if the raw material is used for a solar cell under high-temperature and high-humidity conditions, the durability becomes deficient. Therefore, conventionally, it is common to produce a laminate sheet as separate functional layers of a white color layer and a layer having durability as described in Patent Document 8 and it is difficult to satisfy both.

Further, conventionally, as durability of a polyester film for solar cells, hydrolysis resistance and light resistance are improved and, for example, a polyester film for solar cells with improved hydrolysis resistance is provided according to the above-mentioned proposal. So far, it is assumed to use a solar cell module outdoors, for example, on roofs and therefore, a solar cell module is required to have heat resistance at about 100 to 120° C. and a member such as a polyester film is used for satisfying the demand for the heat resistance. However, in recent years, application of a solar cell module has been developed from installation on a roof to a large scale photovoltaic power plant in a desert area, and increases in size and power increase of a solar cell module have been promoted. As a result, the temperature of electrodes and connector portions is increased and a solar cell module is exposed to a temperature of about 160 to 200° C. for a long duration. If use at such a high temperature is continued for a long time, it is expected that the film strength planned at first is lowered. In such environments, the sunshine duration is long and a solar cell module is to be exposed to a high temperature for a long duration. Further, a solar cell module has been increased in size and power, and the increase in size results in temperature rising and the increase in power results in temperature rising of electrodes and connector portions. If use at such a high temperature is continued for a long time, it is expected that the film strength planned at first is lowered. In the situation that the long-term thermal stability is required more and more as described, it is supposed to be impossible to provide sufficient durability only by the conventional improvement of hydrolysis resistance. Herein, the long term thermal stability is concretely evaluated as a half-life of breaking elongation retention at 160° C. This shows the property how long the initial film property (film strength) can be retained in the case where the film is exposed at a high temperature of 160° C. for a long duration.

Further, as thinning of a solar cell element is advanced, sunlight is transmitted through a silicon thin film and easily reaches directly the back surface protection film. Accordingly, depending on use, decomposition and deterioration of the back surface protection film by light irradiation is becoming a problem. In addition, in a large-scale photovoltaic generation system, since a vast solar cell module is installed, depending on use, the back surface protection film may be decomposed and deteriorated in some cases by light reflection from the ground.

The present invention is for solving the above-mentioned problems, that is, relates to a polyester film for the protection of a back surface of a solar cell with long term thermal stability under high-temperature and high-humidity conditions. The present invention also relates preferably to a polyester film for the protection of a back surface of a solar cell excellent in durability even under light irradiation.

Solutions to the Problems

The inventors of the present application have made investigations to solve the above-mentioned problems and thus have surprisingly found that a type of a catalyst for a polyester affects heat deterioration and use of a polyester obtained by polymerization using a specified polymerization catalyst makes it possible to produce a polyester film for solar cells which exhibits excellent hydrolysis resistance and remarkably excellent long term thermal stability as a polyester film for solar cells and has high durability while keeping high productivity, and this finding has now led to the completion of the present invention.

That is, the present invention is following.

A polyester film for the protection of a back surface of a solar cell containing a polyester, as a main constituent, obtained by polymerization using a polycondensation catalyst containing aluminum and/or its compound as well as a phosphorus compound having an aromatic group in the molecule; having a whiteness degree of 50 or higher; containing 3 to 50% by mass of fine particles with a mean particle diameter of 0.1 to 3 μm; and having an acid value from not lower than 1 (eq/ton) and not higher than 30 (eq/ton).

Effects of the Invention

A polyester film of the present invention for protection of a back surface of a solar cell has high light reflectivity, excellent durability under high-temperature and high-humidity conditions, and also long term thermal stability. In a preferable aspect of the present invention, in addition to the above-mentioned properties, the polyester film has excellent durability under light irradiation. Consequently, the polyester film is useful for a solar cell, particularly for a thin film silicon solar cell.

MODES FOR CARRYING OUT THE INVENTION

A polycondensation catalyst to be used at the time of polymerizing a polyester, which is a main constituent of a polyester film for solar cells of the present invention, may be a catalyst containing aluminum and/or its compound as well as a phosphorus compound having an aromatic group in the molecule; a catalyst containing an aluminum salt of a phosphorus compound; and a catalyst containing at least one compound selected from compounds represented by the general formula (5).

It is possible to use, as well as metallic aluminum, a known aluminum compound as the aluminum and/or the aluminum compound thereof with no limitation.

Specifically, examples of the aluminum compound include: carboxylate salts such as aluminum formate, aluminum acetate, basic aluminum acetate, aluminum propionate, aluminum oxalate; inorganic acid salts such as aluminum chloride, aluminum hydroxide, aluminum hydroxychloride; aluminum alkoxides such as aluminum methoxide, aluminum ethoxide, aluminum iso-propoxide, aluminum n-butoxide, and aluminum t-butoxide; aluminum chelate compounds such as aluminum acetylacetonate, and aluminum acetylacetate; organic aluminum compounds such as trimethylaluminium and triethylaluminium; partial hydrolysates thereof; and aluminum oxide. Among the above aluminum compounds, carboxylate salts, inorganic acid salts, and chelate compounds are preferred, and among these, basic aluminum acetate, aluminum acetate, aluminum chloride, aluminum hydroxide, aluminum hydroxychloride, and aluminum acetylacetonate are more preferred, and basic aluminum acetate is particularly preferred.

The amount of the aluminum and/or the aluminum compound to be added is preferably from 0.001 to 0.05 mole % and is more preferably from 0.005 to 0.02 mole %, relative to the mole number of all the constituent units of the carboxylic acid component such as a dicarboxylic acid or a polyvalent carboxylic acid of the polyester to be obtained. If the amount to be added is less than 0.001 mole %, catalytic activity may not be exerted sufficiently. If the amount to be added is 0.05 mole % or greater, problems may arise such as decreases in the thermal stability and the thermal oxidative stability, and the occurrence of foreign matter and an increase in coloration that are caused by the catalyst. The polymerization catalyst of the present invention is significantly characterized by showing sufficient catalytic activity even if the amount of the aluminum component to be added is thus small. This makes it possible to provide an excellent thermal stability and an excellent thermal oxidative stability, and reduce foreign matter and coloration that are caused by the catalyst.

The phosphorus compound contained in the polycondensation catalyst is not particularly limited, but is preferably one or two or more compounds selected from the group including phosphonic acid compounds and phosphinic acid compounds, because this significantly enhances the catalytic activity. Among these, it is preferable to use one or two or more phosphonic acid compounds, because this particularly significantly enhances the catalytic activity.

The phosphonic acid compound and phosphinic acid compound are compounds having structures represented by the following formulas (6) and (7), respectively.

[Chemical formula 6]

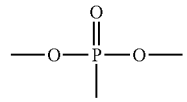

[Chemical formula 7]

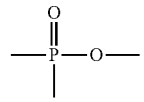

Examples of the phosphonic acid compound include dimethyl methylphosphonate, diphenyl methylphosphonate, dimethyl phenylphosphonate, diethyl phenylphosphonate, diphenyl phenylphosphonate, dimethyl benzylphosphonate, diethyl benzylphosphonate and the like.

Examples of the phosphinic acid compound include diphenylphosphinic acid, methyl diphenylphosphinate, phenyl diphenylphosphinate, phenylphosphinic acid, methyl phenylphosphinate, and phenyl phenylphosphinate.

It is preferable to use compounds represented by the following formulas (8) and (9) as the phosphinic acid compound.

[Chemical formula 8]

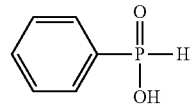

[Chemical formula 9]

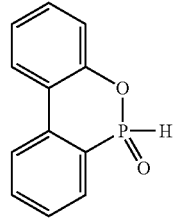

Regarding a polycondensation catalyst of the present invention, it is necessary to use a compound having an aromatic ring structure in the molecule among the phosphorus compounds in order to obtain sufficient catalytic activity.

As a phosphorus compound constituting the polycondensation catalyst, use of compounds represented by the following general formulas (10) and (11) causes a considerably improved effect particularly on the catalytic activity and therefore, it is preferable.

P(=O)R¹(OR²)(OR³)  [Chemical formula 10]

P(=O)R¹R⁴(OR²)  [Chemical Formula 11]

(in the formulas (10) and (11), $R^1$ and $R^4$ each independently denote hydrogen, a $C_{1-50}$ hydrocarbon group, or a $C_{1-50}$ hydrocarbon group containing a hydroxyl group, a halogen group, an alkoxyl group, or an amino group; and $R^2$ and $R^3$ each independently denote hydrogen, a $C_{1-50}$ hydrocarbon group, or a $C_{1-50}$ hydrocarbon group containing a hydroxyl group or an alkoxyl group; herein the hydrocarbon group may have an alicyclic structure such as cyclohexyl or an aromatic ring structure such as phenyl or naphthyl).

As a phosphorus compound constituting the polycondensation catalyst, the compounds represented by the general formulas (10) and (11) in which $R^1$ and $R^4$ are each a group having an aromatic ring structure are particularly preferable.

Examples of the phosphorus compound constituting the polycondensation catalyst include dimethyl methylphosphonate, diphenyl methylphosphonate, dimethyl phenylphosphonate, diethyl phenylphosphonate, diphenyl phenylphosphonate, dimethyl benzylphosphonate, diethyl benzylphosphonate, diphenylphosphinic acid, methyl diphenylphosphinate, phenyl diphenylphosphinate, phenylphosphinic acid, methyl phenylphosphinate, phenyl phenylphosphinate and the like. Among these, dimethyl phenylphosphonate and diethyl benzylphosphonate are particularly preferred.

The amount of the phosphorus compound to be added is preferably from $5 \times 10^{-7}$ to 0.01 moles and is more preferably from $1 \times 10^{-6}$ to 0.005 moles, relative to the mole number of all the constituent units of the carboxylic acid component such as a dicarboxylic acid or a polyvalent carboxylic acid of the polyester to be obtained.

The phosphorus compound constituting the polycondensation catalyst and having a phenolic portion in its molecule is not particularly limited so long as it is a phosphorus compound having a phenolic structure, but the phosphorus compound is preferably one or two or more compounds selected from the group including phosphonic acid compounds and phosphinic acid compounds, each having a phenolic portion in its molecule, because this particularly significantly enhances the catalytic activity. Among these, it is preferable to use one or two or more phosphonic acid compounds having a phenolic portion in its molecule, because this particularly significantly enhances the catalytic activity.

Examples of the phosphorus compound constituting the polycondensation catalyst and having a phenolic portion in its molecule include compounds represented by the following general formulas (12) and (13). Among them, those having the following formula are particularly preferable because they are used to improve the catalytic activity.

P(=O)R¹(OR²)(OR³)  [Chemical formula 12]

P(=O)R¹R⁴(OR²)  [Chemical formula 13]

(in the formulas (12) and (13), $R^1$ denotes a $C_{1-50}$ hydrocarbon group containing a phenolic portion, or a $C_{1-50}$ hydrocarbon group containing a substituent group such as a hydroxyl group, a halogen group, an alkoxyl group, or an amino group and a phenolic portion; $R^4$ each independently denote hydrogen, a $C_{1-50}$ hydrocarbon group, or a $C_{1-50}$ hydrocarbon group containing a substituent group such as a hydroxyl group, a halogen group, an alkoxyl group, or an amino group; $R^2$ and $R^3$ each independently denote hydrogen, a $C_{1-50}$ hydrocarbon group, or a $C_{1-50}$ hydrocarbon group containing a substituent group such as a hydroxyl group or an alkoxyl group; herein the hydrocarbon group may have a branched structure or the terminals of cyclo-$R^2$ and $R^4$ may be bonded to each other).

Examples of the phosphorus compound having a phenolic portion in its molecule include p-hydroxyphenylphosphonic acid, dimethyl p-hydroxyphenylphosphonate, diethyl p-hydroxyphenylphosphonate, diphenyl p-hydroxyphenylphosphonate, bis(p-hydroxyphenyl)phosphinic acid, methyl bis(p-hydroxyphenyl)phosphinate, phenyl bis(p-hydroxyphenyl)phosphinate, p-hydroxyphenylphenylphosphinic acid, methyl p-hydroxyphenylphenylphosphinate, phenyl p-hydroxyphenylphenylphosphinate, p-hydroxyphenylphosphinic acid, methyl p-hydroxyphenylphosphinate, phenyl p-hydroxyphenylphosphinate, and compounds represented by the following formulas (14) to (17). Among them, the compounds represented by the following formula (16) and dimethyl p-hydroxyphenylphosphonate are particularly preferable.

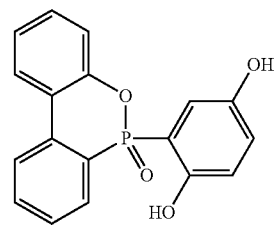

[Chemical formula 14]

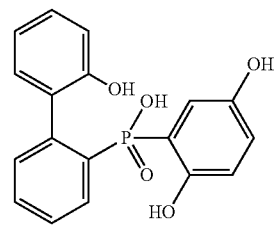

[Chemical formula 15]

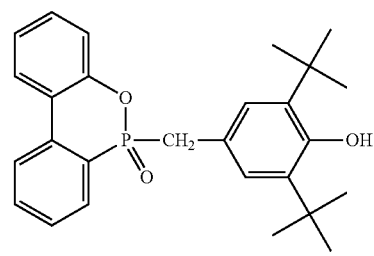

[Chemical formula 16]

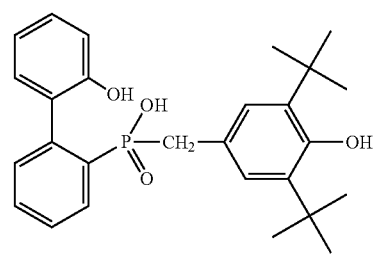

[Chemical formula 17]

As the compounds represented by the formula (16), for example, SANKO-220 (manufactured by Sanko Co. Ltd.) is usable.

The addition of those phosphorus compounds having a phenolic portion in its molecule at the time of polymerization of a polyester can improve the catalytic activity of an aluminum compound and also can improve the thermal stability of the polymerized polyester.

The addition amount of the phosphorus compounds having a phenolic portion in its molecule is preferably $5 \times 10^{-7}$ to 0.01 moles and more preferably $1 \times 10^{-6}$ to 0.005 moles, relative to the mole number of all the constituent units of the carboxylic acid component such as a dicarboxylic acid or a polyvalent carboxylic acid of the polyester to be obtained.

It is also preferable to use a metal salt compound of phosphorus as the phosphorus compound. The metal salt compound of phosphorus is not particularly limited if it is a metal salt of a phosphorus compound and use of a metal salt of a phosphonic acid compound causes a considerably improved effect on catalytic activity and therefore, it is preferable. The metal salt of a phosphorus compound includes a mono-metal salt, a di-metal salt, and a tri-metal salt.

Use of those having metal portions of the metal salts, selected from Li, Na, K, Be, Mg, Sr, Ba, Mn, Ni, Cu, and Zn, among the phosphorus compounds causes a considerably improved effect on catalytic activity and therefore, it is preferable. Among them, Li, Na, and Mg are particularly preferable.

Use of at least one compound selected from compounds represented by the following general formula (18) as the metal salt compound of phosphorus causes a considerably improved effect on catalytic activity and therefore, it is preferable.

[Chemical formula 18]

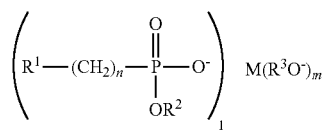

(in the formula (18), $R^1$ denotes hydrogen, a $C_{1-50}$ hydrocarbon group, or a $C_{1-50}$ hydrocarbon group containing a hydroxyl group, a halogen group, an alkoxyl group, or an amino group; $R^2$ denotes hydrogen, a $C_{1-50}$ hydrocarbon group, or a $C_{1-50}$ hydrocarbon group containing a hydroxyl group or an alkoxyl group; $R^3$ denotes hydrogen, a $C_{1-50}$ hydrocarbon group, or a $C_{1-50}$ hydrocarbon group containing a hydroxyl group, an alkoxyl group, or a carbonyl; l is an integer of 1 or higher; m is 0 or an integer of 1 or higher; (l+m) is 4 or lower; M denotes a metal cation with a valence of (l+m); n is an integer of 1 or higher; and the hydrocarbon group may have an alicyclic structure such as cyclohexyl, a branched structure, or an aromatic ring structure such as phenyl or naphthyl).

Examples of the $R^1$ include phenyl, 1-naphthyl, 2-naphthyl, 9-anthryl, 4-biphenyl, 2-biphenyl and the like. Examples of the $R^2$ include hydrogen, a methyl group, an ethyl group, a propyl group, an isopropyl group, a n-butyl group, a sec-butyl group, a tert-butyl group, a long chain aliphatic group, a phenyl group, a naphthyl group, substituted phenyl and naphthyl groups, a group represented by —$CH_2CH_2OH$ and the like. Examples of $R^3O^-$ include a hydroxide ion, an alcoholate ion, an acetate ion, an acetylacetone ion and the like.

It is preferable to use at least one compound selected from compounds represented by the following general formula (19) among the compounds represented by the general formula (18).

[Chemical formula 19]

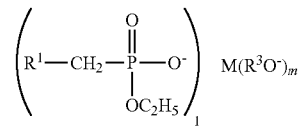

(in the formula (19), $R^1$ denotes hydrogen, a $C_{1-50}$ hydrocarbon group, or a $C_{1-50}$ hydrocarbon group containing a hydroxyl group, a halogen group, an alkoxyl group, or an amino group; $R^3$ denotes hydrogen, a $C_{1-50}$ hydrocarbon group, or a $C_{1-50}$ hydrocarbon group containing a hydroxyl group, an alkoxyl group, or a carbonyl; l is an integer of 1 or higher; m is 0 or an integer of 1 or higher; (l+m) is 4 or lower; M denotes a metal cation with a valence of (l+m); and the hydrocarbon group may have an alicyclic structure such as cyclohexyl, a branched structure, or an aromatic ring structure such as phenyl or naphthyl).

Examples of the $R^1$ include phenyl, 1-naphthyl, 2-naphthyl, 9-anthryl, 4-biphenyl, 2-biphenyl and the like. Examples of $R^3O^-$ include a hydroxide ion, an alcoholate ion, an acetate ion, an acetylacetone ion and the like.

Use of a compound having an aromatic ring structure among the phosphorus compounds causes a considerably improved effect on catalytic activity and therefore, it is preferable.

Use of those containing a metal selected from Li, Na, K, Be, Mg, Sr, Ba, Mn, Ni, Cu, and Zn for M, among the compounds represented by the formula (19), causes a considerably improved effect on catalytic activity and therefore, it is preferable. Among them, Li, Na, and Mg are particularly preferable.

Examples of the metal salt compound of phosphorus include lithium[ethyl (1-naphthyl)methylphosphonate], sodium[ethyl (1-naphthyl)methylphosphonate], magnesium bis[ethyl (1-naphthyl)methylphosphonate], potassium [ethyl (2-naphthyl)methylphosphonate], magnesium bis[ethyl (2-naphthyl)methylphosphonate], lithium [ethyl benzylphosphonate], sodium [ethyl benzylphosphonate], magnesium bis[ethyl benzylphosphonate], beryllium bis[ethyl benzylphosphonate], strontium bis[ethyl benzylphosphonate], manganese bis[ethyl benzylphosphonate], sodium benzylphosphonate, magnesium bis[benzylphosphonic acid], sodium [ethyl (9-anthryl)methylphosphonate], magnesium bis[ethyl (9-anthryl)methylphosphonate], sodium [ethyl 4-hydroxybenzylphosphonate], magnesium bis[ethyl 4-hydroxybenzylphosphonate], sodium [phenyl 4-chlorobenzylphosphonate], magnesium bis[ethyl 4-chlorobenzylphosphonate], sodium [methyl 4-aminobenzylphosphonate], magnesium bis[methyl 4-aminobenzylphosphonate], sodium phenylphosphonate, magnesium bis[ethyl phenylphosphonate], zinc bis[ethyl phenylphosphonate] and the like.

Particularly preferable compounds among them are lithium [ethyl (1-naphthyl)methylphosphonate], sodium [ethyl (1-naphthyl)methylphosphonate], magnesium bis [ethyl (1-naphthyl)methylphosphonate], lithium [ethyl benzylphosphonate], sodium [ethyl benzylphosphonate], magnesium bis[ethyl benzylphosphonate], sodium [benzylphosphonate], magnesium bis[benzylphosphonate] and the like.

Another preferable example of a metal salt compound of phosphorus as a phosphorus compound constituting the polycondensation catalyst may be at least one compound selected from compounds represented by the following general formula (20).

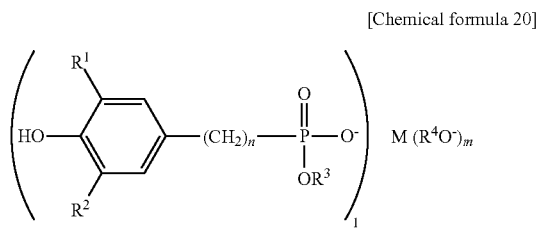
[Chemical formula 20]

(in the formula (20), $R^1$ and $R^2$ each independently denote hydrogen or a $C_{1-30}$ hydrocarbon group; $R^3$ denotes hydrogen, a $C_{1-50}$ hydrocarbon group, or a $C_{1-50}$ hydrocarbon group containing a hydroxyl group or an alkoxyl group; $R^4$ denotes hydrogen, a $C_{1-50}$ hydrocarbon group, or a $C_{1-50}$ hydrocarbon group containing a hydroxyl group, an alkoxyl group, or carbonyl; examples of $R^4O^-$ include a hydroxide ion, an alcoholate ion, an acetate ion, an acetylacetone ion and the like; l is an integer of 1 or higher; m is 0 or an integer of 1 or higher; (l+m) is 4 or lower; M denotes a metal cation with a valence of (l+m); n is an integer of 1 or higher; and the hydrocarbon group may have an alicyclic structure such as cyclohexyl, a branched structure, or an aromatic ring structure such as phenyl or naphthyl).

It is preferable to use at least one compound selected from compounds represented by the following general formula (21) among those compounds.

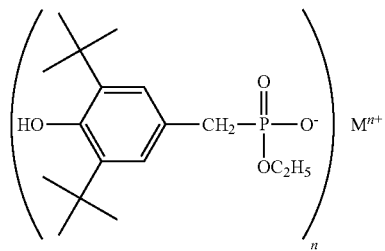
[Chemical formula 21]

(in the formula (21), $M_n^{n+}$ denotes a metal cation with a valence of n; and n denotes 1, 2, 3, or 4).

Use of those containing a metal selected from Li, Na, K, Be, Mg, Sr, Ba, Mn, Ni, Cu, and Zn for M among the compounds represented by the formulas (20) and (21) causes a considerably improved effect on catalytic activity and therefore, it is preferable. Among them, Li, Na, and Mg are particularly preferable.

Examples of the specified metal salt compound of phosphorus include lithium [ethyl 3,5-di-tert-butyl-4-hydroxybenzylphosphonate], sodium [ethyl 3,5-di-tert-butyl-4-hydroxybenzylphosphonate], sodium [3,5-di-tert-butyl-4-hydroxybenzylphosphonic acid], potassium [ethyl 3,5-di-tert-butyl-4-hydroxybenzylphosphonate], magnesium bis[ethyl 3,5-di-tert-butyl-4-hydroxybenzylphosphonate], magnesium bis[3,5-di-tert-butyl-4-hydroxybenzylphosphonic acid], beryllium bis[methyl 3,5-di-tert-butyl-4-hydroxybenzylphosphonate], strontium bis[ethyl 3,5-di-tert-butyl-4-hydroxybenzylphosphonate], barium bis[phenyl 3,5-di-tert-butyl-4-hydroxybenzylphosphonate], manganese bis[ethyl 3,5-di-tert-butyl-4-hydroxybenzylphosphonate], nickel bis[ethyl 3,5-di-tert-butyl-4-hydroxybenzylphosphonate], copper bis[ethyl 3,5-di-tert-butyl-4-hydroxybenzylphosphonate], zinc bis[ethyl 3,5-di-tert-butyl-4-hydroxybenzylphosphonate] and the like. Particularly preferable examples among them are lithium [ethyl 3,5-di-tert-butyl-4-hydroxybenzylphosphonate], sodium [ethyl 3,5-di-tert-butyl-4-hydroxybenzylphosphonate], and magnesium bis[ethyl 3,5-di-tert-butyl-4-hydroxybenzylphosphonate].

Another embodiment of the present invention is a polyester polymerization catalyst containing at least one selected from aluminum salts of phosphorus compounds. Another aluminum compound, phosphorus compound, or phenol compound may be used in combination with an aluminum salt of a phosphorus compound.

The aluminum salt of a phosphorus compound, a preferable component constituting the polycondensation catalyst, is not particularly limited if it is a phosphorus compound having an aluminum portion and use of an aluminum salt of a phosphonic acid compound causes a considerably improved effect on catalytic activity and therefore, it is preferable. The aluminum salt of a phosphorus compound includes a mono-aluminum salt, a di-aluminum salt, and a tri-aluminum salt.

Use of a compound having an aromatic ring structure among the aluminum salts of phosphorus compounds causes a considerably improved effect on catalytic activity and therefore, it is preferable.

Use of at least one compound selected from compounds represented by the following general formula (34) as the aluminum salt of a phosphorus compound constituting the polymerization catalyst causes a considerably improved effect on catalytic activity and therefore, it is preferable.

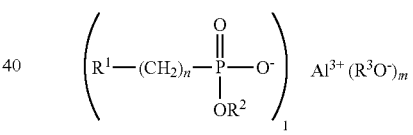
[Chemical formula 22]

(in the formula (22), $R^1$ denotes hydrogen, a $C_{1-50}$ hydrocarbon group, or a $C_{1-50}$ hydrocarbon group containing a hydroxyl group, a halogen group, an alkoxyl group, or an amino group; $R^2$ denotes hydrogen, a $C_{1-50}$ hydrocarbon group, or a $C_{1-50}$ hydrocarbon group containing a hydroxyl group or an alkoxyl group; $R^3$ denotes hydrogen, a $C_{1-50}$ hydrocarbon group, or a $C_{1-50}$ hydrocarbon group containing a hydroxyl group, an alkoxyl group, or a carbonyl; l is an integer of 1 or higher; m is 0 or an integer of 1 or higher; (l+m) is 3; n is an integer of 1 or higher; and the hydrocarbon group may have an alicyclic structure such as cyclohexyl, a branched structure, or an aromatic ring structure such as phenyl or naphthyl).

Examples of the $R^1$ include phenyl, 1-naphthyl, 2-naphthyl, 9-anthryl, 4-biphenyl, 2-biphenyl and the like. Examples of the $R^2$ include hydrogen, a methyl group, an ethyl group, a propyl group, an isopropyl group, a n-butyl group, a sec-butyl group, a tert-butyl group, a long chain aliphatic group, a phenyl group, a naphthyl group, substituted phenyl and naphthyl groups, a group represented by —$CH_2CH_2OH$ and the like. Examples of the $R^3O^-$ include a hydroxide ion, an alcoholate ion, an ethylene glycolate ion, an acetate ion, an acetylacetone ion and the like.

Examples of the aluminum salt of a phosphorus compound include an aluminum salt of ethyl (1-naphthyl)methylphosphonate), an aluminum salt of (1-naphthyl)methylphosphonic acid, an aluminum salt of ethyl (2-naphthyl)methylphosphonate, an aluminum salt of ethyl benzylphosphonate, an aluminum salt of benzylphosphonic acid, an aluminum salt of ethyl (9-anthryl)methylphosphonate, an aluminum salt of ethyl 4-hydroxybenzylphosphonate, an aluminum salt of ethyl 2-methylbenzylphosphonate, an aluminum salt of phenyl 4-chlorobenzylphosphonate, an aluminum salt of methyl 4-aminobenzylphosphonate, an aluminum salt of ethyl 4-methoxybenzylphosphonate, an aluminum salt of ethyl phenylphosphonate and the like.

Particularly preferable compounds among them are aluminum salt of ethyl (1-naphthyl)methylphosphonate and aluminum salt of ethyl benzylphosphonate.

Another embodiment of the present invention is a polyester polymerization catalyst containing at least one salt selected from aluminum salts of phosphorus compounds represented by the following general formula (23). Another aluminum compound, a phosphorus compound, or a phenol compound may be used in combination with an aluminum salt of a phosphorus compound.

[Chemical formula 23]

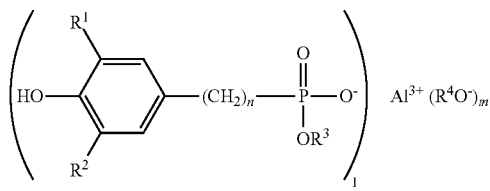

(in the formula (23), $R^1$ and $R^2$ each independently denote hydrogen or a $C_{1-30}$ hydrocarbon group; $R^3$ denotes hydrogen, a $C_{1-50}$ hydrocarbon group, or a $C_{1-50}$ hydrocarbon group containing a hydroxyl group or an alkoxyl group; $R^4$ denotes hydrogen, a $C_{1-50}$ hydrocarbon group, or a $C_{1-50}$ hydrocarbon group containing a hydroxyl group, an alkoxyl group, or carbonyl; l is an integer of 1 or higher; m is 0 or an integer of 1 or higher; (l+m) is 3; n is an integer of 1 or higher; and the hydrocarbon group may have an alicyclic structure such as cyclohexyl, a branched structure, or an aromatic ring structure such as phenyl or naphthyl).

It is preferable to use at least one compound selected from compounds represented by the following general formula (24) among those compounds.

[Chemical formula 24]

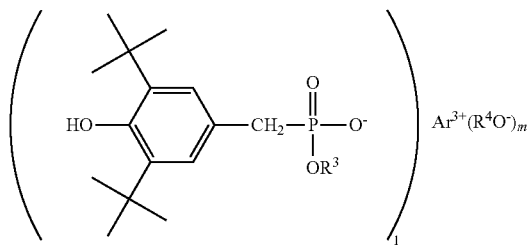

(in the formula (24), $R^3$ denotes hydrogen, a $C_{1-50}$ hydrocarbon group, or a $C_{1-50}$ hydrocarbon group containing a hydroxyl group or an alkoxyl group; $R^4$ denotes hydrogen, a $C_{1-50}$ hydrocarbon group, or a $C_{1-50}$ hydrocarbon group containing a hydroxyl group, an alkoxyl group, or carbonyl; l is an integer of 1 or higher; m is 0 or an integer of 1 or higher; (l+m) is 3; and the hydrocarbon group may have an alicyclic structure such as cyclohexyl, a branched structure, or an aromatic ring structure such as phenyl or naphthyl).

Examples of the $R^3$ include hydrogen, a methyl group, an ethyl group, a propyl group, an isopropyl group, a n-butyl group, a sec-butyl group, a tert-butyl group, a long chain aliphatic group, a phenyl group, a naphthyl group, substituted phenyl and naphthyl groups, a group represented by —$CH_2CH_2OH$ and the like. Examples of the $R^4O^-$ include a hydroxide ion, an alcoholate ion, an ethylene glycolate ion, an acetate ion, an acetylacetone ion and the like.

Examples of the aluminum salt of a phosphorus compound include an aluminum salt of ethyl 3,5-di-tert-butyl-4-hydroxybenzylphosphonate, an aluminum salt of methyl 3,5-di-tert-butyl-4-hydroxybenzylphosphonate, an aluminum salt of isopropyl 3,5-di-tert-butyl-4-hydroxybenzylphosphonate, an aluminum salt of phenyl 3,5-di-tert-butyl-4-hydroxybenzylphosphonate, an aluminum salt of 3,5-di-text-butyl-4-hydroxybenzylphosphonic acid and the like.

Particularly preferable examples among them are an aluminum salt of ethyl 3,5-di-tert-butyl-4-hydroxybenzylphosphonate and an aluminum salt of methyl 3,5-di-tert-butyl-4-hydroxybenzylphosphonate.

It is also preferable to use a phosphorus compound having at least one P—OH bond as the phosphorus compound. A phosphorus compound having at least one P—OH bond is not particularly limited if it is a phosphorus compound having one P—OH bond in a molecule. Use of a phosphonic acid compound having at least one P—OH bond among the phosphorus compounds causes a considerably improved effect on catalytic activity and therefore, it is preferable.

Use of a compound having an aromatic ring structure among the phosphorus compounds causes a considerably improved effect on catalytic activity and therefore, it is preferable.

Use of at least one compound selected from compounds represented by the following general formula (25) as the phosphorus compound having at least one P—OH bond and constituting the polycondensation catalyst causes a considerably improved effect on catalytic activity and therefore, it is preferable.

[Chemical formula 25]

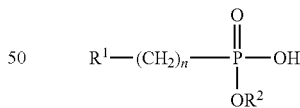

(in the formula (25), $R^1$ denotes hydrogen, a $C_{1-50}$ hydrocarbon group, or a $C_{1-50}$ hydrocarbon group containing a hydroxyl group, a halogen group, an alkoxyl group, or an amino group; $R^2$ denotes hydrogen, a $C_{1-50}$ hydrocarbon group, or a $C_{1-50}$ hydrocarbon group containing a hydroxyl group or an alkoxyl group; n is an integer of 1 or higher; and the hydrocarbon group may have an alicyclic structure such as cyclohexyl, a branched structure, or an aromatic ring structure such as phenyl or naphthyl).

Examples of the $R^1$ include phenyl, 1-naphthyl, 2-naphthyl, 9-anthryl, 4-biphenyl, 2-biphenyl and the like. Examples of the $R^2$ include hydrogen, a methyl group, an ethyl group, a propyl group, an isopropyl group, a n-butyl group, a sec-butyl group, a tert-butyl group, a long chain aliphatic group, a phenyl group, a naphthyl group, substituted phenyl and naphthyl groups, a group represented by —CH₂CH₂OH and the like.

Use of a compound having an aromatic ring structure among the phosphorus compounds causes a considerably improved effect on catalytic activity and therefore, it is preferable.

Examples of the phosphorus compound having at least one P—OH bond include ethyl (1-naphthyl)methylphosphonate, (1-naphthyl)methylphosphonic acid, ethyl (2-naphthyl)methylphosphonate, ethyl benzylphosphonate, benzylphosphonic acid, ethyl (9-anthryl)methylphosphonate, ethyl 4-hydroxybenzylphosphonate, ethyl 2-methylbenzylphosphonate, phenyl 4-chlorobenzylphosphonate, methyl 4-aminobenzylphosphonate, ethyl 4-methoxybenzylphosphonate and the like. Particularly preferable compounds among them are ethyl (1-naphthyl)methylphosphonate and ethyl benzylphosphonate.

Examples of a preferable phosphorus compound also include specified phosphorous compounds having at least one P—OH bond. A specified phosphorus compound having at least one P—OH bond, which is a preferable phosphorus compound constituting the polycondensation catalyst, means at least one compound selected from compounds represented by the following general formula (26).

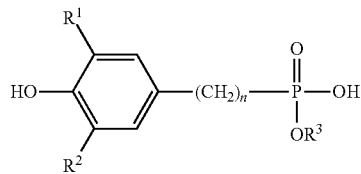

[Chemical formula 26]

(in the formula (26), $R^1$ and $R^2$ each independently denote hydrogen or a $C_{1-30}$ hydrocarbon group; $R^3$ denotes hydrogen, a $C_{1-50}$ hydrocarbon group, or a $C_{1-50}$ hydrocarbon group containing a hydroxyl group or an alkoxyl group; n is an integer of 1 or higher; and the hydrocarbon group may have an alicyclic structure such as cyclohexyl, a branched structure, or an aromatic ring structure such as phenyl or naphthyl).

It is preferable to use at least one compound selected from compounds represented by the following general formula (27) among those compounds.

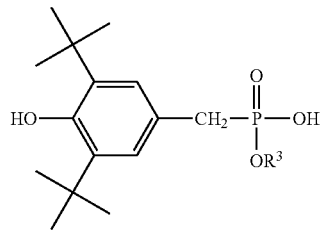

[Chemical formula 27]

(in the formula (27), $R^3$ denotes hydrogen, a $C_{1-50}$ hydrocarbon group, or a $C_{1-50}$ hydrocarbon group containing a hydroxyl group or an alkoxyl group; and the hydrocarbon group may have an alicyclic structure such as cyclohexyl, a branched structure, or an aromatic ring structure such as phenyl or naphthyl).

Examples of the $R^3$ include hydrogen, a methyl group, an ethyl group, a propyl group, an isopropyl group, a n-butyl group, a sec-butyl group, a tert-butyl group, a long chain aliphatic group, a phenyl group, a naphthyl group, substituted phenyl and naphthyl groups, a group represented by —CH₂CH₂OH and the like.

Examples of the specified phosphorus compound having at least one P—OH bond include ethyl 3,5-di-tert-butyl-4-hydroxybenzylphosphonate, methyl 3,5-di-tert-butyl-4-hydroxybenzylphosphonate, isopropyl 3,5-di-tert-butyl-4-hydroxybenzylphosphonate, phenyl 3,5-di-tert-butyl-4-hydroxybenzylphosphonate, octadecyl 3,5-di-tert-butyl-4-hydroxybenzylphosphonate, 3,5-di-tert-butyl-4-hydroxybenzylphosphonic acid and the like. Particularly preferable examples among them are ethyl 3,5-di-tert-butyl-4-hydroxybenzylphosphonate and methyl 3,5-di-tert-butyl-4-hydroxybenzylphosphonate.

Examples of a preferable phosphorus compound include phosphorous compounds represented by the following chemical formula (28).

$$R^1—CH_2—P(=O)(OR^2)(OR^3)$$ [Chemical formula 28]

(in the formula (28), $R^1$ denotes a $C_{1-49}$ hydrocarbon group, or a $C_{1-49}$ hydrocarbon group containing a hydroxyl group, a halogen group, an alkoxyl group, or an amino group; and $R^2$ and $R^3$ each independently denote hydrogen, a $C_{1-50}$ hydrocarbon group, or a $C_{1-50}$ hydrocarbon group containing a hydroxyl group or an alkoxyl group; and the hydrocarbon group may have an alicyclic structure, a branched structure, or an aromatic ring structure).

Further preferable compounds are those in which at least one of $R^1$, $R^2$, and $R^3$ in the chemical formula (28) has an aromatic ring structure.

Specific examples of the phosphorus compound are as follows.

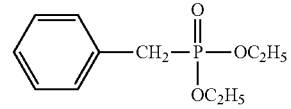

[Chemical formula 29]

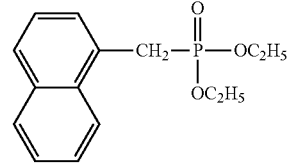

[Chemical formula 30]

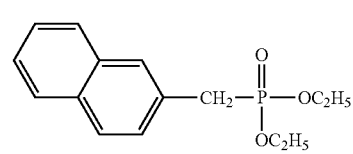

[Chemical formula 31]

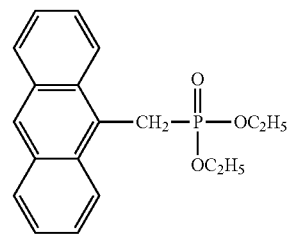

[Chemical formula 32]

-continued

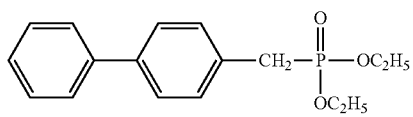
[Chemical formula 33]

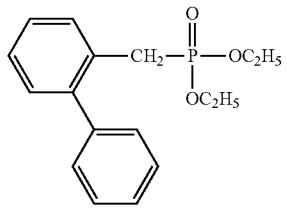
[Chemical formula 34]

The phosphorus compound is preferably one having a high molecular weight since it is difficult to be distilled off at the time of polymerization.

Another preferable phosphorus compound to be used as the polycondensation catalyst is at least one phosphorus compound selected from compounds represented by the following general formula (35).

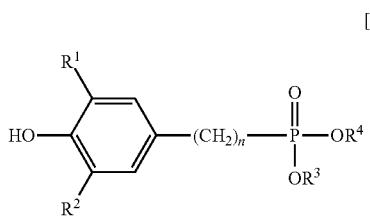
[Chemical formula 35]

(in the formula (35), $R^1$ and $R^2$ each independently denote hydrogen or a $C_{1-30}$ hydrocarbon group; $R^3$ and $R^4$ each independently denote hydrogen, a $C_{1-50}$ hydrocarbon group, or a $C_{1-50}$ hydrocarbon group containing a hydroxyl group or an alkoxyl group; n is an integer of 1 or higher; and the hydrocarbon group may have an alicyclic structure such as cyclohexyl, a branched structure, or an aromatic ring structure such as phenyl or naphthyl).

Use of at least one compound selected from the compounds represented by the following general formula (35) among those represented by the general formula (36) causes a considerably improved effect on catalytic activity and therefore, it is preferable.

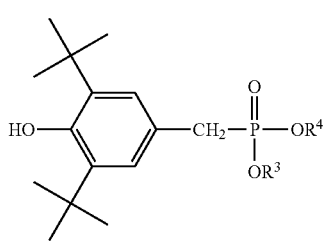
[Chemical formula 36]

(in the formula (36), $R^3$ and $R^4$ each independently denote hydrogen, a $C_{1-50}$ hydrocarbon group, or a $C_{1-50}$ hydrocarbon group containing a hydroxyl group or an alkoxyl group; and the hydrocarbon group may have an alicyclic structure such as cyclohexyl, a branched structure, or an aromatic ring structure such as phenyl or naphthyl).

Examples of the $R^3$ and $R^4$ include hydrogen, short chain aliphatic groups such as a methyl group and a butyl group, a long chain aliphatic group such as an octadecyl group, a phenyl group, a naphthyl group, substituted phenyl and naphthyl groups, a group represented by —$CH_2CH_2OH$ and the like.

Examples of the specified phosphorus compound include diisopropyl 3,5-di-tert-butyl-4-hydroxybenzylphosphonate, di-n-butyl 3,5-di-tert-butyl-4-hydroxybenzylphosphonate, dioctadecyl 3,5-di-tert-butyl-4-hydroxybenzylphosphonate, diphenyl 3,5-di-tert-butyl-4-hydroxybenzylphosphonate and the like.

Particularly preferable examples among them are dioctadecyl 3,5-di-tert-butyl-4-hydroxybenzylphosphonate and diphenyl 3, 5-di-tert-butyl-4-hydroxybenzylphosphonate.

Another preferable phosphorus compound to be used as a polycondensation catalyst is at least one compound selected from compounds represented by the chemical formulas (37) and (38).

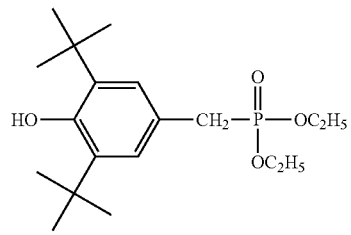
[Chemical formula 37]

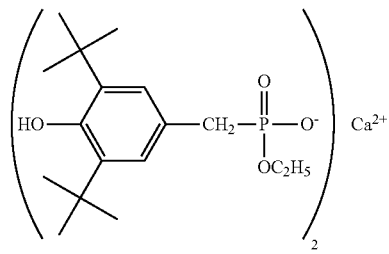
[Chemical formula 38]

As the compound represented by the chemical formula (37) is commercialized Irganox 1222 (manufactured by Ciba Specialty Chemicals Inc.). As the compound represented by the chemical formula (38) is commercialized Irganox 1425 (manufactured by Ciba Specialty Chemicals Inc.).

The above-exemplified compounds are preferably usable as a phosphorus compound. Especially, diphenylphosphinic acid and the phosphorus compounds represented by the general formulas (Chemical formula 29), (Chemical formula 30), (Chemical formula 33), and (Chemical formula 37) are suitably used since these compounds suitably promote the catalytic activity of an aluminum compound, and particularly, the phosphorus compound represented by the general formula (Chemical formula 37) is preferable.

Phosphorus compounds have been generally well known as an antioxidant; however, it has not been known that melt polymerization can be significantly promoted by combination use of these phosphorus compounds with a conventional metal-containing polyester polymerization catalyst. Actually, at the time of melt polymerization of a polyester using an antimony compound, a titanium compound, a tin compound, or a germanium compound, which is a representative catalyst for polyester polymerization, as a polymerization catalyst, even if a phosphorus compound is added, it is not confirmed that the polymerization is promoted to an actually useful level.

That is, a sufficient catalytic effect can be exhibited by using the phosphorus compounds in combination even if the content of aluminum in the polyester polymerization catalyst is low.

The addition amount of the phosphorus compounds is preferably 0.0001 to 0.1% by mole and more preferably 0.005 to 0.05% by mole relative to the number of moles of the entire constituent units of the dicarboxylic acid component constituting the polyester. If the addition amount of the phosphorus compounds is lower than 0.0001% by mole, the addition effect is not exhibited in some cases. On the other hand, the addition in an amount exceeding 0.1% by mole rather contrarily decreases the catalytic activity as the polyester polymerization catalyst in some case. The tendency of the decrease is changed in accordance with the addition amount of aluminum.

Prevention of coloration due to decrease in thermal stability is investigated by using an aluminum compound as a main catalytic component and decreasing the addition amount of an aluminum compound and further adding a cobalt compound without using a phosphorus compound in the case where an aluminum compound is used as a main catalyst, but the addition of a cobalt compound in such an amount as to sufficiently give a catalytic activity decreases thermal stability after all. Consequently, it is difficult to satisfy both by this technique.

Use of the phosphorus compound having the specified chemical structure gives a polycondensation catalyst which can cause a sufficient catalytic effect without decreasing the thermal stability or causing a problem of foreign matter generation even in the case where the addition amount of aluminum as a metal-containing component is low, and use of a polyester polymerized by this polycondensation catalyst improves the thermal stability of a polyester film after melt molding.

Even if phosphoric acid or a phosphoric acid ester such as trimethyl phosphate is added in place of the phosphorus compounds, no addition effect described above can be observed. Even if the phosphorus compounds are used in the preferable addition amount range in combination with a conventional metal-containing polyester polycondensation catalyst such as an antimony compound, a titanium compound, a tin compound, or a germanium compound, no effect of promoting melt polymerization reaction can be observed.

On the other hand, in addition to aluminum or its compound, a small amount of at least one metal or its compound selected from alkali metals, alkaline earth metals, and their compounds may coexist as a second metal-containing component. Coexistence of the second metal-containing component in the catalyst system gives a catalytic component with heightened catalytic activity in addition to the effect of suppressing production of diethylene glycol and accordingly heightened reaction speed and thus it is effective to improve the productivity.

A technique of giving a catalyst having sufficient catalytic activity by adding an alkali metal compound or an alkaline earth metal compound to an aluminum compound is known. Use of such a conventionally known catalyst gives a polyester excellent in thermal stability and it is required to increase the addition amount of the catalyst in the case of the conventional catalyst using an alkali metal compound or an alkaline earth metal compound in combination in order to obtain practically usable catalytic activity.

In the case where an alkali metal compound is used in combination, the amount of foreign matter attributed to that is increased and therefore, the intervals of filter replacement tend to be shorter in the melt extrusion step at the time of film production and film defects tend to be increased.

In the case where an alkaline earth metal compound is used in combination, if it is tried to obtain practically applicable activity, the thermal stability and heat oxidation stability of the obtained polyester are lowered and coloration due to heating becomes noticeable and the generation amount of foreign matter is increased.

The addition amount M (% by mole) of an alkali metal, an alkaline earth metal or their compound is preferably $1 \times 10^{-6}$ or higher and less than 0.1% by mole, more preferably $5 \times 10^{-6}$ to 0.05% by mole, even more preferably $1 \times 10^{-5}$ to 0.03% by mole, and particularly more preferably $1 \times 10^{-5}$ to 0.01% by mole, relative to the number of moles of the entire polycarboxylic acid units constituting the polyester.

That is, since the addition amount of an alkali metal or an alkaline earth metal is small, the reaction speed can be heightened without causing problems of decrease in thermal stability, foreign matter generation, coloration, etc. In addition, problems such as lowering of hydrolysis resistance are not caused.

If the addition amount M of an alkali metal, an alkaline earth metal, or their compound is 0.1% by mole or higher, problems of decrease in thermal stability, increases in foreign matter generation and coloration, and lowering of hydrolysis resistance in terms of processing of products may occur in some cases. If M is lower than $1 \times 10^{-6}$% by mole, the effect of the addition is not apparent.

An alkali metal or an alkaline earth metal to be preferably used as a second metal-containing component in addition to the above-mentioned aluminum or its compound is preferably at least one metal selected from Li, Na, K, Rb, Cs, Be, Mg, Ca, Sr, and Ba, and use of an alkali metal or its compound is more preferable.

In the case of using an alkali metal or its compound, Li, Na, and K are particularly preferable as the alkali metal. Examples of compounds of an alkali metal and an alkaline earth metal include salts of these metals with saturated aliphatic carboxylic acids such as formic acid, acetic acid, propionic acid, butyric acid, and oxalic acid; unsaturated aliphatic carboxylic acids such as acrylic acid and methacrylic acid; aromatic carboxylic acids such as benzoic acid; halogen-containing carboxylic acids such as trichloroacetic acid; hydroxycarboxylic acids such as lactic acid, citric acid, and salicylic acid; inorganic acids such as carbonic acid, sulfuric acid, nitric acid, phosphoric acid, phosphonic acid, hydrogen carbonate, hydrogen phosphate, hydrogen sulfide, sulfurous acid, thiosulfuric acid, hydrochloric acid, hydrobromic acid, chloric acid, and bromic acid; organic sulfonic acids such as 1-propanesulfonic acid, 1-pentanesulfonic acid, and naphthalenesulfonic acid; organic sulfuric acids such as laurylsulfuric acid; and alkoxides such as methoxy, ethoxy, n-propoxy, iso-propoxy, n-butoxy, and tert-butoxy; chelating compounds such as acetylacetonate; hydrides, oxides, and hydroxides of these metals.

In the case of using hydroxides or the like with high alkalinity among these alkali metals, alkaline earth metals, and their compounds, since it tends to be difficult to dissolve these metals or compounds in an organic solvent, e.g., a diol such as ethylene glycol or an alcohol, they have to be added in form of an aqueous solution to the polymerization system and it may sometimes become a problem in the polymerization step.

Further, in the case of using hydroxides or the like with high alkalinity, the polyester tends to be subject to the side reaction such as hydrolysis or the like and the polymerized polyether tends to be colored and the hydrolysis resistance tends to be lowered.

Consequently, suitable examples of the alkali metal or its compound and the alkaline earth metal or its compound may be salts of the alkali metal and the alkaline earth metal with saturated aliphatic carboxylic acids, unsaturated aliphatic carboxylic acids, aromatic carboxylic acids, halogen-containing carboxylic acids, hydroxycarboxylic acids, inorganic acids selected from sulfuric acid, nitric acid, phosphoric acid, phosphonic acid, hydrogen phosphate, hydrogen sulfide, sulfurous acid, thiosulfuric acid, hydrochloric acid, hydrobromic acid, chloric acid, and bromic acid, organic sulfonic acids, and organic sulfuric acids; and chelating compounds and oxides of the alkali metal or the alkali earth metal. More particularly preferable among them are salts of the alkali metal and the alkaline earth metal with saturated aliphatic carboxylic acids in terms of handling easiness and availability, and use of acetic acid salts is particularly preferable.

The catalyst for the polyester to be used in the present invention has catalytic activity not only in a polymerization reaction but also in an esterification reaction and a transesterification reaction. For example, polymerization by the transesterification reaction between an alkyl ester of a dicarboxylic acid such as dimethyl terephthalate and a glycol such as ethylene glycol is normally performed in the presence of a transesterification catalyst such as a titanium compound or a zinc compound. The catalyst according to the claims of the present invention, however, can also be used instead of, or together with, these catalysts. Further, the catalysts described above have catalytic activity not only in a melt polymerization but also in a solid-state polymerization and a solution polymerization. This makes it possible to manufacture by any of these methods a polyester resin suitable for the manufacturing of a polyester film. In order to provide a polyester film with durability in the present invention, it is preferable to use a polyester with an intrinsic viscosity exceeding 0.60 dl/g, and in order to adjust the intrinsic viscosity, it is desirable to carry out solid-state polymerization after polymerization.

A polyester polymerization catalyst to be used in the present invention may be added to the reaction system in an arbitrary step of the polymerization reaction. For example, it may be added to the reaction system in an arbitrary step such as an arbitrary step before or during an esterification reaction or a transesterification reaction, or an arbitrary step immediately before or during a polycondensation reaction. Particularly, aluminum or its compound is preferable to be added immediately before starting of the polycondensation reaction.

A method of adding a polyester polycondensation catalyst to be used in the present invention is not particularly limited and the catalyst may be added in a powder state or in a neat state, or in a slurry state or in a solution state using ethylene glycol or the like as a solvent. Another component, preferably the phenol compound or the phosphorus compound of the present invention, previously mixed with an aluminum metal or its compound, may also be added or they may be added separately. Another component, preferably the phenol compound or the phosphorus compound of the present invention, may be added to the polymerization system at the same addition timing as that of an aluminum metal or its compound or they may be added respectively at different timing.

It is preferable not to use another polymerization catalyst of an antimony compound, a titanium compound, a germanium compound, a tin compound, etc. for the polyester polycondensation catalyst to be used in the present invention; however, a proper amount of the catalyst is allowed to coexist to such an extent that any problem is not caused on properties, processability, and color tone of the polyester.

Concretely, the addition amount of an antimony compound is preferably 50 ppm or lower and more preferably 30 ppm or lower in terms of antimony atom in the polyester to be obtained by polymerization. If the conversion amount of antimony atom exceeds 50 ppm, metal antimony is precipitated and the polyester becomes blackish and it is not preferably in appearance. Further, foreign matter attributed to metal antimony is increased and it is not preferable for the use in which strict requests in terms of defects are demanded.

The addition amount of a titanium compound is preferably 10 ppm or lower, more preferably 5 ppm or lower, even more preferably 2 ppm or lower, and particularly more preferably 1 ppm or lower in terms of titanium atom in the polyester to be obtained by polymerization. If the amount of titanium atom exceeds 10 ppm in terms of titanium atom, the thermal stability of a resin to be obtained is considerably lowered.

Concretely, the addition amount of a germanium compound is preferably 20 ppm or lower and more preferably 10 ppm or lower in terms of germanium atom in the polyester to be obtained by polymerization. If the amount of germanium atom exceeds 20 ppm, it results in disadvantage in terms of cost and therefore, it is not preferable.

The kind of the antimony compound, titanium compound, germanium compound and tin compound is not particularly limited.

Concretely, examples of the antimony compound include antimony trioxide, antimony pentoxide, antimony acetate antimony glycoxide, and the like, and among them, antimony trioxide is preferable.

Examples of the titanium compound include tetra-n-propyl titanate, tetraisopropyl titanate, tetra-n-butyl titanate, tetraisobutyl titanate, tetra-tert-butyl titanate, tetracyclohexyl titanate, tetraphenyl titanate, titanium oxalate, and the like, and among them, tetra-n-butoxy titanate is preferable.

Examples of the germanium compound include germanium dioxide, germanium tetrachloride, and the like, and between them, germanium dioxide is preferable.

Examples of the tin compound include dibutyltin oxide, methylphenyltin oxide, tetraethyltin, hexaethylitin oxide, triethyltin hydroxide, monobutylhydroxytin oxide, triisobutyl tin acetate, diphenyltin dilaurate, monobutyltin trichloride, dibutyltin sulfide, dibutylhydroxytin oxide, methylstannoic acid, ethylstannoic acid, and the like, and among them, using of monobutylhydroxytin oxide is preferable.

The polyester to be used as a film raw material in the present invention refers to one composed of one or two or more compounds selected from polyvalent carboxylic acids including dicarboxylic acids and their ester-formable derivatives and one or two or more polyhydric alcohols including glycols; one composed of hydroxycarboxylic acids and ester-formable derivatives thereof; or one composed of cyclic esters.

Preferable polyesters may be polyesters containing, as a main acid component, terephthalic acid or its ester-formable derivatives or naphthalenedicarboxylic acid or its ester-formable derivatives and, as a main glycol component, alkylene glycols.

The polyesters containing, as a main acid component, terephthalic acid or its ester-formable derivatives or naphthalenedicarboxylic acid or its ester-formable derivatives are polyesters containing preferably 70% by mole or more, more preferably 80% by mole or more, and even more preferably 90% by mole or more of terephthalic acid, its ester-formable derivatives, naphthalenedicarboxylic acid, and its ester-formable derivatives in total in the entire acid components.

The polyesters containing, as a glycol component, alkylene glycols are polyesters containing preferably 70% by mole or more, more preferably 80% by mole or more, and even more preferably 90% by mole or more of alkylene glycols in total in the entire glycol components.

Preferable dicarboxylic acids copolymerizable with terephthalic acid or naphthalenedicarboxylic acid are aromatic dicarboxylic acids such as ortho-phthalic acid, isophthalic acid, 4,4'-biphenyldicarboxylic acid, 4,4'-biphenylsulfone dicarboxylic acid, 4,4'-biphenyl ether dicarboxylic acid, 1,2-bis(phenoxy)ethane-p,p'-dicarboxylic acid, pamoic acid, and anthracenedicarboxylic acid, or their ester-formable derivatives, since they do not lower the hydrolysis resistance. Further, tri- or higher functional carboxylic acid components such as pyromellitic acid and trimellitic acid may be copolymerized.

Examples of the glycols include aliphatic glycols, e.g., alkylene glycols, polyethylene glycols, polytrimethylene glycols, and polytetramethylene glycols, such as ethylene glycol, 1,2-propylene glycol, 1,3-propylene glycol, diethylene glycol, triethylene glycol, 1,2-butylene glycol, 1,3-butylene glycol, 2,3-butylene glycol, 1,4-butylene glycol, 1,5-pentanediol, neopentyl glycol, 1,6-hexanediol, 1,2-cyclohexanediol, 1,3-cyclohexanediol, 1,4-cyclohexanediol, 1,2-cyclohexanedimethanol, 1,3-cyclohexanedimethanol, 1,4-cyclohexanedimethanol, 1,4-cyclohexanediethanol, 1,10-decamethylene glycol, and 1,12-dodecanediol; and aromatic glycols such as hydroquinone, 4,4'-dihydroxybisphenol, 1,4-bis($\beta$-hydroxyethoxy)benzene, 1,4-bis($\beta$-hydroxyethoxyphenyl)sulfone, bis(p-hydroxyphenyl)ether, bis(p-hydroxyphenyl)sulfone, bis(p-hydroxyphenyl)methane, 1,2-bis(p-hydroxyphenyl)ethane, bisphenol A, bisphenol C, 2,5-naphthalenediol, and glycols obtained by adding ethylene oxide to these glycols.

Among these glycols, alkylene glycols are preferable, and ethylene glycol, 1,3-propylene glycol, 1,4-butylene glycol, and 1,4-cyclohexanedimethanol are more preferable. The alkylene glycols may have a substituent group or an alicyclic structure in the molecular chain and two or more kinds may be used together.

Examples of polyhydric alcohols other than these glycols include trimethylolmethane, trimethylolethane, trimethylolpropane, pentaerythritol, glycerol, hexanetriol, and the like.

Polyesters to be particularly preferably used in the present invention among them are polyethylene terephthalate, polybutylene terephthalate, polypropylene terephthalate, poly(1,4-cyclohexanedimethylene terephthalate), polyethylene naphthalate, polybutylene naphthalate, polypropylene naphthalate and their copolymers, and especially preferable polyesters are polyethylene terephthalate and its copolymers.

The thermal stability of a polyester can be further heightened by removing a catalyst from the obtained polyester or inactivating the catalyst by adding a phosphorus compound after polymerization of the polyester.

Dialkylene glycol is produced as a byproduct during the polymerization of a polyester and the dialkylene glycol lowers heat resistance. For example, in the case of diethylene glycol as a representative dialkylene glycol, the amount of diethylene glycol is preferably 2.3% by mole or lower. It is more preferably 2.0% by mole or lower, and even more preferably 1.8% by mole or lower. The heat resistance and stability can be heightened by controlling the amount of diethylene glycol in the above-mentioned range, and increase in carboxyl terminal concentration due to decomposition at the time of drying or molding can be lowered. Further, decomposition due to heat for curing a filler material at the time of sealing a cell can also be suppressed to a low level. Polymerization of a polyester is preferably carried out by a continuous polymerization method but not by a batch method. In this case, a basic aluminum acetate which has high solubility and is easy to be added to the polymerization reaction is preferably used as an aluminum compound. In addition, the amount of diethylene glycol is better as it is lower and it is produced as a byproduct at the time of the esterification reaction of terephthalic acid or at the time of the transesterification reaction of dimethyl terephthalate in the case of polyester production, and the lower limit is practically 1.0% by mole, and more practically 1.2% by mole.

Because of using a polyester obtained by polymerization using a specified catalyst species, the film of the present invention has a half-life of breaking elongation retention of 700 hours or longer, more preferably 800 hours or longer in a heat resistance test at 160° C. The film of the present invention having it within the range is provided with so sufficient long-term thermal stability as to stand long-term use even in a solar cell which is increased in size and power.

The intrinsic viscosity (IV) value of the film of the present invention is preferably 0.60 to 0.90 dl/g in order to obtain high heat resistance and hydrolysis resistance, more preferably 0.62 to 0.85 dl/g, and even more preferably 0.65 to 0.8 dl/g. In the case where the IV value is lower than 0.60 dl/g, the hydrolysis resistance and heat resistance are not sufficient, and in the case where it is higher than 0.90 dl/g, the back pressure in the melting step is so high as to lower the productivity and promotes heat deterioration due to shearing heat generation, and therefore, it is not preferable.

The acid value of the polyester to be a raw material for a film is preferably not lower than 1 (eq/ton) and not higher than 30 (eq/ton); more preferably not lower than 2 (eq/ton) and not higher than 20 (eq/ton); and even more preferably not lower than 2 (eq/ton) and not higher than 16 (eq/ton). If it exceeds 30 (eq/ton), it becomes impossible to obtain a film with good hydrolysis resistance. A polyester with the acid value of less than 1 (eq/ton) is difficult to be industrially produced.

The carboxyl terminal concentration of polyester chips can be controlled within the above-mentioned range by properly selecting the polymerization condition of the resin. It can be controlled by properly setting, for example, production apparatus factors such as the structure of an esterification reaction apparatus, the composition ratio of a dicarboxylic acid and glycol in a slurry to be supplied to the esterification reaction bath, the esterification reaction conditions such as the esterification reaction temperature, the esterification reaction pressure, and the esterification reaction time, and solid-state polymerization conditions. Further, it is preferable to control the amount of moisture in polyester chips or to control the resin temperature in the melting step as described above. A method for blocking carboxyl terminals of the polyester with an epoxy compound or a carbodiimide compound is also a preferable method. Particularly, since a specified catalyst species is used for the polyester of the present invention, the carboxyl terminals of the polyester can be more suitably lowered. Conventionally, an antimony compound or the like, to be used as a polymerization catalyst for polyesters, has a high catalytic capacity for the polymerization reaction but scarcely exerts activity on the esterification reaction. On the other hand, an aluminum compound to be used for the present invention has a high catalytic capacity for the polymerization reaction and also has high activity on the esterification reaction. Therefore, the carboxyl terminal consumption due the ester bond is significant and the carboxyl terminal concentration can be suitably lowered.

The breaking elongation retention of the film of the present invention, which is evaluation of hydrolysis resistance, is 60% or higher, preferably 70% or higher, and more preferably 80% or higher. If it is less than 60%, the durability as a back surface protection film for a solar cell is too low to use the film. The hydrolysis resistance property of the film of the present invention can be controlled within the above range by controlling the acid value of the film.

The film of the present invention contains fine particles having a mean particle diameter of 0.1 to 3 µm in an amount of 3 to 50% by mass, preferably 4 to 25% by mass, relative to the entire mass of the film. In the case where it is 0.1 µm or smaller or exceeds 3 µm, even if the addition amount is increased, it becomes difficult to increase a whiteness degree of the film to 50 or higher. In the case it is less than 3% by mass, it becomes difficult to increase a whiteness degree to 50 or higher. In the case where it exceeds 50% by mass, the film weight is increased and it becomes difficult to handle the film in processing or the like.

The mean particle diameter of the present invention is determined by electron microscopy. Concretely, the following method is employed.

The fine particles are observed by a scanning electron microscope, the magnification is properly changed in accordance with the size of the particles, and the obtained photograph is enlarged and copied. Next, regarding at least 200 fine particles selected at random, the outer circumferences of the respective particles are traced. The equivalent circle diameters of particles in the traced images are measured with an image analysis apparatus and the mean value is defined as the mean particle diameter.

Inorganic or organic particles may be used as the fine particles in the present invention. Examples of these fine particles may be of silica, kaolinite, talc, calcium carbonate, zeolite, alumina, barium sulfate, carbon black, zinc oxide, titanium oxide, zinc sulfide, organic white pigments, etc. without any particular limit. In terms of whiteness degree improvement and productivity, titanium oxide or barium sulfate is preferable and titanium oxide is more preferable. Titanium oxide may be any of anatase and rutile types. Further, the surface of the fine particles may be subjected to inorganic treatment with alumina or silica, or to silicon type or alcohol type organic treatment.

In a preferable aspect of the film of the present invention, it is preferable for the film to have excellent durability under light irradiation. Concretely, the breaking elongation retention is preferably 35% or higher and more preferably 40% or higher in the case of UV irradiation at irradiation intensity of 100 mW/cm$^2$ for 100 hours under condition of 63° C. and 50% Rh. The film of the present invention is suppressed from photodecomposition or deterioration even if being irradiated by light irradiation and thus the film is more suitable as a back surface protection film of a solar cell to be used outdoors.

In order to control the durability in the above-mentioned range under light irradiation, it is preferable to add fine particles of titanium dioxide of mainly rutile type to the film of the present invention. Mainly two crystal forms of titanium oxide, rutile type and anatase type, are known and the anatase type has considerably high spectral reflectance of ultraviolet rays, whereas the rutile type has high absorbance of ultraviolet rays (low spectral reflectance). The present inventors pay attention to the difference of the spectral properties of the crystal forms of titanium dioxide and consequently improve the light resistance in a polyester film for the protection of a back surface of a solar cell by utilizing the ultraviolet absorption performance of the rutile type. Consequently, the present invention provides a film excellent in durability under light irradiation substantially without adding another ultraviolet absorber. Therefore, a problem such as pollution due to bleeding out of the ultraviolet absorber or decrease in adhesion is scarcely caused.

As described above, titanium dioxide particles in the present invention is mainly of the rutile type. Herein, "mainly" means that the amount of rutile type titanium dioxide in all of the titanium dioxide particles exceeds 50% by mass. Further, the amount of anatase type titanium dioxide in all of the titanium dioxide particles is preferably 10% by mass or lower. It is more preferably 5% by mass or lower and even more preferably 0% by mass. If the content of anatase type titanium dioxide exceeds the above-mentioned upper limit, the amount of rutile type titanium dioxide is decreased in all of the titanium dioxide particles and thus the ultraviolet absorption performance sometimes becomes insufficient and also since anatase type titanium dioxide has high photocatalytic function, the light resistance tends to be lowered due this function. Rutile type titanium dioxide and anatase type titanium dioxide can be distinguished by x-ray structural diffraction and spectral absorption properties.

Regarding the rutile type titanium dioxide fine particles in the present invention, the surface of the fine particles may be subjected to inorganic treatment with alumina or silica, or to silicon type or alcohol type organic treatment. Before being added to a polyester composition, rutile type titanium dioxide may be adjusted in the particle diameter, or coarse particles may be removed through a refining process. As an industrial means for the refining process, for example, a pulverization means such as a jet mill and a ball mill can be employed, and as a classification means, for example, dry or wet centrifugation may be employed.

A conventionally known method for adding fine particles to a film can be employed and a master-batch method (MB method) of previously mixing a polyester resin and fine particles by an extruder is preferable. Further, it is also possible to employ a method of charging a polyester resin which is not previously dried and fine particles to an extruder and producing MB while removing water or degassing air. Further, a method of producing MB using a polyester resin which is previously dried more or less can more suppress increase in the acid value of the polyester. In this case, examples to be employed include a method of extrusion while degassing and a method of extrusion of a polyester resin which is sufficiently dried without degassing.

In the case of producing MB, for example, it is preferable to lower the moisture content for a polyester resin to be charged, by previously drying. As drying condition, drying is carried out preferably at 100 to 200° C. and more preferably at 120 to 180° C. for 1 hour or longer, preferably 3 hours or longer, and more preferably 6 hours or longer. Accordingly, the polyester resin is dried so sufficiently as to adjust the moisture amount to be 50 ppm or lower and preferably 30 ppm or lower. A preliminary mixing method is not particularly limited and a batch method or a uniaxial or biaxial kneading extruder may be employed. In the case of producing MB while degassing, it is preferable to employ a method of melting a polyester resin at a temperature of 250° C. to 300° C., preferably 270° C. to 280° C., providing one, preferably two or more degassing openings in a preliminary kneader, and keeping the inside of a mixing apparatus under reduced pressure by continuously suction-degassing at 0.05 MPa or higher, preferably 0.1 MPa or higher.

The present invention aims to satisfy both whiteness degree and durability, which are conventionally difficult to be satisfied together. Accordingly, the present invention is characterized in that the above-mentioned acid value can be satisfied while the film contains particles in a high concentration.

The film of the present invention may have a large number of fine voids in the inside. Consequently, higher whiteness degree can be suitably obtained. In that case, the apparent specific gravity is not lower than 0.7 and not higher than 1.3, preferably not lower than 0.9 and not higher than 1.3, and more preferably not lower than 1.05 and not higher than 1.2. If it is lower than 0.7, the film is deficient in stiffness and it becomes difficult to process the film at the time of solar cell module production. On the other hand, although a film with the apparent specific gravity exceeding 1.3 is also within the range for a film of the present invention, in the case of a film with the apparent specific gravity exceeding 1.3, since the weight of the film is high, it may possibly become a hindrance for making a solar cell lightweight.

The fine voids may be formed by using the fine particles and/or a thermoplastic resin described below and incompatible with a polyester. The voids derived from the fine particles or a thermoplastic resin incompatible with a polyester mean voids existing around the fine particles or the thermoplastic resin, and the voids can be confirmed with a cross-section photograph of the film by an electron microscope.

The thermoplastic resin is optionally added to a polyester to be used in the present invention, and it is not particularly limited if it is incompatible with the polyester. Concretely, examples thereof include a polystyrene resin, a polyolefin resin, a polyacrylic resin, a polycarbonate resin, a polysulfone resin, a cellulose resin and the like. Particularly, a polystyrene resin or a polyolefin resin such as polymethylpentene or polypropylene may be preferably used.

The mixing amount of the void formation agent, that is, a thermoplastic resin incompatible with a polyester, to the polyester is preferably within a range of 3 to 20% by mass and more preferably within a range of 5 to 18% by mass relative to the entire film body, although it differs depending on the quantity of voids to be aimed. If it is less than 3% by mass, increase in the formation amount of voids is limited. Contrarily, if it is 20% by mass or more, the elongation of the film is considerably lowered and heat resistance, strength and stiffness are also lowered and therefore, it is not preferable.

A polyester film for the protection of a back surface of a solar cell of the present invention can be a voids-containing polyester film. The polyester film of the present invention may have a monolayer configuration or a multilayer configuration composed of two or more layers. As the multilayer configuration, preferable aspect of the present invention is a film having a skin layer, which is of a polyester layer containing a large number of voids derived from the fine particles with a mean particle diameter of 0.1 to 3 μm, and a core layer, which is a polyester layer containing a large number of voids derived from particles and/or an incompatible thermoplastic resin in a polyester. Its production method is not particularly limited and arbitrary and, for example, the film may be produced as follows. At first, as a method for bonding a skin layer to the film surface, it is most preferable to employ a co-extrusion method of supplying a polyester resin of a skin layer containing fine particles and a polyester resin of a core layer containing an incompatible thermoplastic resin to different extruders and thereafter, extruding both polyester resins out of a single die in a melted state.

In the case where particles are added to the core layer and the skin layer, it is preferable that the particle content is made higher in the skin layer from the viewpoint of giving high light reflection in the film surface. In this case, the concentration of the particles in the skin layer is preferably 5 to 50% by mass and more preferably 8 to 30% by mass. The concentration of the particles in the skin layer is preferably 1 to 15% by mass and more preferably 3 to 10% by mass.

Respective raw materials are mixed and charged to an extruder, melted, and extruded out of a T-die, and closely attached to cooling rolls to obtain an unstretched sheet. The unstretched sheet is biaxially oriented by stretching (roll-stretching) between rolls with different speed difference, stretching (tenter-stretching) by holding and widening the sheet with clips, or stretching (inflation-stretching) by widening with air pressure. The orientation treatment causes interface separation between polyester/incompatible thermoplastic resin and polyester/fine particles and produces a large number of fine voids. Consequently, the condition of stretching and orienting treatment for the unstretched sheet is closely related to the production of the voids.

First, the first lengthwise stretching step is the most important process for forming a large number of fine voids in the film inside. The lengthwise stretching is carried out by two or a large number of rolls with different peripheral speeds. A heating means at that time may be a method of using heating rolls and a method employing a non-contact heating method, and both may be employed in combination. As the most preferable stretching method among them is a method of employing roll heating and non-contact heating in combination. In this case, the film is previously heated at a temperature from 50° C. to the glass transition point of the polyester or lower by using heating rolls and thereafter heated by an infrared heater.

Next, the uniaxially stretched film thus obtained is introduced into a tenter and stretched 2.5 to 5 times in the width direction. A preferable stretching temperature in this case is 100° C. to 200° C. The biaxially stretched film thus obtained is subjected to heat treatment if necessary. The heat treatment is preferably carried out in the tenter and preferably carried out in a range from a melting point Tm −50° C. to Tm of the polyester.

Further, in order to provide the film of the present invention with flame retardance, it is also a preferable aspect to add a flame retardant. As such a flame retardant, a phosphorus compound and a polyester resin copolymerized with the phosphorus compound can be suitably used. Further, a resin layer containing a flame retardant may be laminated to give the flame retardance. As such a flame retardant, magnesium hydroxide or the like may be suitably used in addition to the above-mentioned flame retardants.

The film thus obtained has a whiteness degree of 50 or higher and preferably 60 or higher. If it is lower than 50, film observation with eyes becomes difficult at the time of processing a solar cell module, and the processability is lowered.

EXAMPLES

Hereinafter, Examples and Comparative Examples of the present invention will be described. The measurement and evaluation methods employed in the present invention are described as follows.

1) Apparent Specific Gravity

A film was accurately cut out in a square shape of 10 cm×10 cm and its thickness was measured at 50 points to determine the mean thickness t (unit μm). Next, the mass of each sample was measured up to the 0.1 mg order and denoted as w (unit g). The apparent specific gravity was calculated according to the following equation.

Apparent specific gravitation (-)=(w/t)×1000

2) Whiteness Degree

Measurement of the whiteness degree was carried out by JIS-L1015-1981-B method using Z-1001DP manufactured by Nippon Denshoku Industries Co., Ltd.

3) Acid Value

The acid values of a film and a raw material polyester resin were measured by the following method.

(1) Preparation of Sample

A film or a raw material polyester resin was crushed and vacuum-dried at 70° C. for 24 hours, and thereafter weighed in a range of 0.20±0.0005 g with a balance. In the case where the acid value was measured for respective layers, each sample was produced by extruding a monolayer of the respective layers and used as a sample for the layer. The mass at that time was defined as W (g). To a test tube were added 10 ml of benzyl alcohol and the weighed each sample, and the test tube was immersed in a benzyl alcohol bath heated to 205° C. and the sample was dissolved while being stirred with a glass rod. Samples obtained by adjusting the dissolution time to be 3 minutes, 5 minutes, and 7 minutes were denoted respectively as A, B, and C. Next, new test tubes were made available and only benzyl alcohol was loaded thereto and subjected to the treatment in the same procedure and samples obtained by adjusting the dissolution time to be 3 minutes, 5 minutes, and 7 minutes were denoted respectively as a, b, and c.

(2) Titration

Titration was carried out using a 0.04 mol/l potassium hydroxide solution (ethanol solution) with a previously known factor. Phenol red was used as an indicator and the moment where the greenish yellow color was changed rose pink was defined as a finishing point and the titration amount (ml) of the potassium hydroxide solution was determined. The titration amounts of the samples A, B, and C were denoted as XA, XB, and XC (ml). The titration amounts of the samples a, b, and c were denoted as Xa, Xb, and Xc (ml).

(3) Calculation of Acid Value

Using the titration amounts XA, XB, and XC for the respective dissolution times, the titration amount V (ml) at a dissolution time of 0 min was calculated by a least squares method. Similarly, the titration amount V0 (ml) was calculated using Xa, Xb, and Xc. Next, the acid value was calculated according to the following equation.

Carboxyl terminal concentration (eq/ton)=[(V−V0)× 0.04×NF×1000]/W

NF: Factor of 0.04 mol/l potassium hydroxide solution

4) Hydrolysis Resistance

HAST (Highly Accelerated temperature and humidity Stress Test) standardized in JIS-60068-2-66 was carried out. The test was carried out using EHS-221 manufactured by ESPEC Corp. under conditions of 105° C., 100% Rh, and 0.03 MPa.

Each film was cut into a size of 70 mm×190 mm and each film was set by a jig. Each film was set at a distance enough to be kept from one another. Each film was treated under conditions of 105° C., 100% Rh, and 0.03 MPa for 200 hours.

5) Light Resistance

An accelerated light resistance test was carried out using Eye Super UV tester, SUV-W 151 manufactured by Iwasaki Electric Co., Ltd. by continuous UV irradiation treatment at 63° C., 50% Rh, and an irradiation intensity of 100 mW/cm$^2$ for 100 hours.

6) Breaking Elongation Retention

The hydrolysis resistance and light resistance were evaluated in accordance with the breaking elongation retention. The breaking elongation of each sample before treatment and after treatment was measured according to JIS C 2318-1997 5.3.31 (tensile strength and elongation) and the breaking elongation retention was calculated according to the following equation.

Breaking elongation retention (%)=[(breaking elongation after treatment)×100]/(breaking elongation before treatment)

7) Half-Life of Breaking Elongation Retention in Heat Resistance Test at 160° C.

Each film was longitudinally cut into a strip-like sample with a length of 200 mm and a width of 10 mm to be used. According to a method standardized in JIS K-7127, the breaking elongation was measured at 25° C. and 65% RH using a tensile tester. The initial tensile chuck interval was set to be 100 mm and the tensile speed was set to be 300 m/min. The measurement was carried out 20 times while changing samples and the mean value (X) of their breaking elongation was determined. Each strip-like sample with a length of 200 mm and a width of 10 mm was set in a gear oven, left in an atmosphere at a temperature of 160° C. and naturally cooled, and the tensile test was carried out for the sample 20 times in the same condition as described above and the mean value (Y) of the breaking elongation was determined. The breaking elongation retention was determined from the obtained mean values (X) and (Y) according to the following equation.

Elongation retention (%)=(Y/X)×100

The heat treatment time until the elongation retention was 50% or lower was measured and it was defined as the half-life of breaking elongation retention.

7) Content of Diethylene Glycol (DEG)

After 0.1 g of each polyester was heated and decomposed at 250° C. in 2 ml of methanol, quantitative analysis was carried out by gas chromatography to determine the content.

Example 1

(Preparation of Polyethylene Terephthalate Resin (PET-I))

(1) Preparation of Polycondensation Catalyst Solution (Preparation of Ethylene Glycol Solution of Phosphorus Compound)

After 2.0 L of ethylene glycol was added under normal temperature and normal pressure to a flask equipped with a nitrogen introduction pipe and a cooling pipe, while being stirred at 200 rpm under a nitrogen atmosphere, 200 g of Irganox 1222 (manufactured by Ciba Specialty Chemicals Inc.) as a phosphorus compound represented by the chemical formula (39) was added. After 2.0 L of ethylene glycol was additionally added, the setting of the jacket temperature was changed to 196° C. and the temperature was increased and from the moment where the inner temperature became 185° C. or higher, the contents were stirred under refluxing condition for 60 minutes. Thereafter, the heating was stopped and the solution was taken out of a heat source immediately, and while the nitrogen atmosphere being kept, the solution was cooled to 120° C. or lower within 30 minutes. The molar fraction of Irganox 1222 in the obtained solution was 40% and the molar fraction of the compound modified from Irganox 1222 by structure deformation was 60%.

(Preparation of Aqueous Solution of Aluminum Compound)

After 5.0 L of pure water was added under normal temperature and normal pressure to a flask equipped with a cooling pipe, while being stirred at 200 rpm, 200 g of basic aluminum acetate was added in form of a slurry with pure water. Further, pure water was added so as to adjust the entire volume to be 10.0 L and stirred in normal temperature and normal pressure for 12 hours. Thereafter, the setting of the jacket temperature was changed to 100.5° C. and the temperature was increased, and from the moment where the inner temperature was 95° C. or higher, the contents were stirred under refluxing condition for 3 hours. The stirring was stopped and the solution was left to be cooled to room temperature to obtain an aqueous solution.

(Preparation of Mixed Solution of Aluminum Compound in Ethylene Glycol)

Ethylene glycol in an equivalent volume was added to the aqueous solution of the aluminum compound obtained in the above-mentioned method and stirred at room temperature for 30 minutes, and thereafter, the inner temperature was controlled to be 80 to 90° C. and the pressure was gradually reduced finally to 27 hPa, and the water was distilled off from the system while being stirred for several hours to obtain a 20 g/l solution of the aluminum compound in ethylene glycol. The peak integration value ratio of peaks in $^{27}$Al-NMR spectrum for the obtained aluminum solution was 2.2.

(2) Esterification Reaction and Polycondensation 1 part by mass of terephthalic acid with high purity and ethylene glycol at a ratio of 0.75 parts by mass to 1 part by mass of terephthalic acid with high purity were continuously supplied to a slurry preparation tank of a continuous polyester production apparatus comprising 3 continuous esterification reaction tanks and 3 polycondensation reaction tanks and equipped with an inline mixer having a high speed stirrer in a transportation line from the third esterification reaction tank to the first polycondensation reaction tank. A polyester oligomer was obtained by continuously supplying the prepared slurry, adjusting the first esterification tank to a reaction temperature of 250° C. and 110 kPa, the second esterification tank to a reaction temperature of 260° C. and 105 kPa, and the third esterification tank to a reaction temperature of 260° C. and 105 kPa, and continuously charging 0.025 parts by mass of ethylene glycol to the second esterification reaction tank. The polyethylene terephthalate resin (PET-I) with a limiting viscosity of 0.59 and an acid value of 10.5 (eq/ton) was prepared by continuously transporting the oligomer to the continuous polycondensation apparatus including 3 reaction tanks; continuously adding the ethylene glycol solution of the aluminum compound and the ethylene glycol solution of the phosphorus compound obtained in the above-mentioned methods so as to give 0.015% by mole of aluminum atom and 0.036% by mole of phosphorus atom relative to the acid components in the polyester, to the inline mixer installed in the transportation line while stirring with the stirring type mixer; and carrying out polycondensation in the initial polycondensation reaction tank at 265° C. and 9 kPa, the middle polycondensation reaction tank at 265 to 268° C. and 0.7 kPa, and the final polycondensation reaction tank at 273° C. and 13.3 kPa.

(Preparation of Polyethylene Terephthalate Resin (PET-II))

The polyethylene terephthalate resin (PET-II) with a value limiting viscosity of 0.75 and an acid value of 5.0 (eq/ton) was prepared using a rotation type vacuum polymerization apparatus by carrying out solid-state polymerization of the polyethylene terephthalate resin (PET-II) prepared in the above-mentioned manner at 220° C. under reduced pressure of 0.5 mmHg while changing the time.

(Preparation of Fine Particles-Containing Master Batch)

A mixture obtained by mixing 50% by mass of rutile type titanium dioxide with a mean particle diameter of 0.3 μm (measured by electron microscopy) with 50% by mass of the polyethylene terephthalate resin (PET-I) previously dried at 120° C. in $10^{-3}$ torr for 8 hours was supplied to a bent type biaxial extruder and kneaded for about 20 minutes and continuously suctioned at 0.1 MPa and extruded at 275° C. while being degassed to obtain pellets of the rutile type titanium dioxide fine particles-containing master batch (MB-I). The acid value of the pellets was 12.0 (eq/ton).

(Preparation of Film)

Next, a raw material of an (A) layer obtained by mixing 50% by mass of the polyethylene terephthalate resin (PET-II) prepared in the above-mentioned manner and 50% by mass of the MB-I prepared previously and a raw material of a (B) layer obtained by mixing 70% by mass of the PET-II and 30% by mass of the MB-I were respectively charged to separate extruders, mixed and melted at 280° C., and then, the B layer was bonded in the melted state to one face of the A layer using a feed block. At that time, the discharge amount ratio of the A layer and the B layer was controlled using a gear pump. Successively, the raw materials are extruded with a T die on a cooling drum adjusted to 30° C. to form an unstretched sheet of A/B/A layers.

(Preparation of Biaxially Stretched Film)

The obtained unstretched sheet was evenly heated to 70° C. using heating rolls and roll-stretched 3.3 times at 90° C. The obtained uniaxially stretched film was led to a tenter, heated to 140° C., transversely stretched 3.7 times in the width direction, subjected to heat treatment at 220° C. for 5 seconds while fixing the width, and further relaxed by 4% in the width direction at 220° C. to obtain a plastic film for the protection of a back surface of a solar cell with a thickness of 188 μm (19/150/19).

Example 2

(Preparation of Void Formation Agent)

A void formation agent (MB-II) was prepared by mixing, as a raw material, pellets containing 20% by mass of polystyrene (G797N, manufactured by Japan PolyStyrene Inc.) with a melt flow rate of 1.5, 20% by mass of vapor-phase polymerized polypropylene (F300 SP, manufactured by Idemitsu Kosan Co., Ltd.) with a melt flow rate of 3.0, and 60% by mass of polymethylpentene (TPX DX-820, manufactured by Mitsui Chemicals Inc.) with a melt flow rate of 180; supplying the pellets to a biaxial extruder; and sufficiently kneading the pellets.

A plastic film for the protection of a back surface of a solar cell was obtained in the same manner as that in Example 1, except that PET-II:MB-I:MB-II as a raw material for the B layer was changed to be 80:12:8 (% by mass).

Comparative Example 1

A plastic film for the protection of a back surface of a solar cell was obtained in the same manner as that in Example 2, except that the acid value of the polyethylene terephthalate resin as a film raw material was changed to be 29.5 (PET-III).

Example 3

Fine particles-containing master batch (MB-III) pellets were prepared by supplying a mixture obtained by mixing 50% by mass of anatase type titanium dioxide with a mean particle diameter of 0.3 μm (measured by electron microscopy) with 50% by mass of the polyethylene terephthalate resin (PET-I) as a raw material to a bent type biaxial extruder, kneading, and extruding the mixture at 275° C. while degassing in the preparation of a fine particles-containing master batch. The acid value of the pellets was 11.9 (eq/ton). A plastic film for the protection of a back surface of a solar cell was obtained in the same manner as that in Example 2, except that MB-III was used in place of the fine particles-containing master batch MB-I.

Comparative Example 2

Fine particles (titanium oxide)-containing master batch (MB-IV) pellets were prepared by supplying a mixture obtained by mixing 50% by mass of rutile type titanium dioxide with a mean particle diameter of 0.3 μm (measured by electron microscopy) with 50% by mass of polyethylene terephthalate resin (PET-I) stored in a paper bag in a site where temperature and humidity were not controlled and which was not dried and had a limiting viscosity of 0.59 and an acid value of 10.5 (eq/ton) as a raw material to a bent type biaxial extruder, kneading at 305° C. while degassing in the preparation of a fine particles-containing master batch. The acid value of the pellets was 36.6 (eq/ton). A plastic film for the protection of a back surface of a solar cell was obtained in the same manner as that in Example 2, except that MB-IV was used in place of the fine particles-containing master batch MB-I.

Example 4

A plastic film for the protection of a back surface of a solar cell was obtained in the same manner as that in Example 2, except that in the preparation of a fine particles-containing master batch, barium sulfate (MB-V) with a mean particle diameter of 0.6 μm was used in place of the rutile type titanium dioxide and MB-V was used in place of the MB-I as the raw material for the A layer.

Comparative Example 3

A polyethylene terephthalate resin (PET-IV) with a limiting viscosity of 0.75 and a carboxyl terminal concentration of 8.0 (eq/ton) was prepared by transesterifying 100 parts by mass of dimethylene terephthalate and 64 parts by mass of ethylene glycol using 0.09 parts by mass of calcium acetate as a catalyst; thereafter carrying out polymerization with 0.03% by mass of trimethylphosphate and antimony trioxide, and further carrying out solid-state polymerization using a rotation type vacuum polymerization apparatus at 220° C. under reduced pressure of 0.5 mmHg while changing the time. A plastic film for the protection of a back surface of a solar cell was obtained in the same manner as that in Example 2, except that PET-IV was used in place of the PET-II.

Example 5

(PET-VI)

High purity terephthalic acid and ethylene glycol in a 2-fold molar amount were charged to a heat medium circulation type 2 L stainless steel autoclave equipped with a stirrer, 0.3% by mole of triethylamine was added to the acid component, and esterification reaction was carried out at 245° C. under pressure of 0.25 MPa for 120 minutes while water being distilled out of the system to obtain a mixture of bis(2-hydroxyethyl) terephthalate (BHET) and an oligomer, having an esterification ratio of 95% (hereinafter, referred to as a BHET mixture). A 2.6 g/l solution of aluminum acetylacetonate in ethylene glycol was added to the BHET mixture so as to give 0.015% by mole of aluminum atom to the acid component in the polyester, and 0.02% by mole of the phosphorus compound of Example 1 to the acid component was added thereto and the mixture was stirred at 245° C. and normal pressure under nitrogen atmosphere for 10 minutes. Next, the pressure of the reaction system was gradually decreased to 13.3 Pa while the temperature being increased to 275° C. over 50 minutes and polycondensation reaction was carried out at 275° C. and 13.3 Pa to obtain PET-V with a limiting viscosity of 0.59 and an acid value of 11.0 (eq/ton). PET-VI with a limiting viscosity of 0.75 and an acid value of 5.5 (eq/ton) was prepared using a rotation type vacuum polymerization apparatus by carrying out solid-state polymerization of the obtained resin PET at 220° C. under reduced pressure of 0.5 mmHg while changing the time.

MB-VI was prepared in the same manner as that for MB-I, except that PET-V was used in place of the PET-I.

(Production of Polyester Film)

A plastic film for the protection of a back surface of a solar cell was obtained in the same manner as that in Example 2, except that PET-VI and MB-VI were used in place of the PET-II and MB-I.

Example 6

A plastic film for the protection of a back surface of a solar cell was obtained in the same manner as that in Example 2, except that the resin configuration of the A layer was changed as shown in Table.

TABLE 1

| | | Example 1 | | Example 2 | | Comparative Example 1 | | Example 3 | | Comparative Example 2 | |
|---|---|---|---|---|---|---|---|---|---|---|---|
| Raw material of A layer (wt. %) | | PET-II | 50 | PET-II | 50 | PET-III | 50 | PET-II | 50 | PET-II | 50 |
| | | MB-I | 50 | MB-I | 50 | MB-I | 50 | MB-III | 50 | MB-IV | 50 |

TABLE 1-continued

| Raw material of B layer (wt. %) | PET-II | 70 | PET-II | 80 | PET-III | 80 | PET-II | 80 | PET-II | 80 |
|---|---|---|---|---|---|---|---|---|---|---|
| | MB-I | 30 | MB-I | 12 | MB-I | 12 | MB-III | 12 | MB-IV | 12 |
| | | | MB-II | 8 | MB-II | 8 | MB-II | 8 | MB-II | 8 |
| Acid value of the film (eq/ton) | 9.5 | | 10.5 | | 61.0 | | 10.1 | | 65.9 | |
| DEG (mass %) | 1.6 | | 1.6 | | 1.6 | | 1.6 | | 1.6 | |
| Whiteness degree | 95 | | 96 | | 94 | | 97 | | 92 | |
| Apparent specific gravity | | | 1.1 | | 1.08 | | 1.09 | | 1.09 | |
| Hydrolysis resistance Breaking elongation retention (%) | 90 | | 89 | | 19 | | 88 | | 0 | |
| Light resistance Breaking elongation retention (%) | 91 | | 65 | | 33 | | 17 | | 55 | |
| In the long term heat resistance Half-life time of elongation at 160° C. | 870 | | 880 | | 150 | | 880 | | 150 | |

| | Example 4 | | Comparative Example 3 | | Example 5 | | Example 6 | |
|---|---|---|---|---|---|---|---|---|
| Raw material of A layer (wt. %) | PET-II | 50 | PET-IV | 50 | PET-III | 50 | PET-II | 80 |
| | MB-V | 50 | MB-I | 50 | MB-VI | 50 | MB-I | 20 |
| Raw material of B layer (wt. %) | PET-II | 80 | PET-IV | 80 | PET-III | 80 | PET-II | 80 |
| | MB-V | 12 | MB-I | 12 | MB-VI | 12 | MB-I | 12 |
| | MB-II | 8 | MB-II | 8 | MB-II | 8 | MB-II | 8 |
| Acid value of the film (eq/ton) | 11.7 | | 12.0 | | 11.0 | | 9.5 | |
| DEG (mass %) | 1.6 | | 1.6 | | 3.5 | | 1.6 | |
| Whiteness degree | 92 | | 95 | | 96 | | 92 | |
| Apparent specific gravity | 1.09 | | 1.1 | | 1.1 | | 1.07 | |
| Hydrolysis resistance Breaking elongation retention (%) | 83 | | 75 | | 88 | | 90 | |
| Light resistance Breaking elongation retention (%) | 4 | | 85 | | 64 | | 41 | |
| In the long term heat resistance Half-life time of elongation at 160° C. | 750 | | 600 | | 740 | | 870 | |

INDUSTRIAL APPLICABILITY

A polyester film for the protection of a back surface of a solar cell of the present invention is excellent in durability, light reflectivity, and also long term thermal stability under high-temperature and high-humidity conditions and under light irradiation and is useful as a material constituting a back surface protection film of a solar cell.

The invention claimed is:

1. A polyester film for the protection of a back surface of a solar cell containing
   (a) a polyester, as a main constituent, obtained by polymerization using a polycondensation catalyst containing aluminum and/or its compound and a phosphorus compound having an aromatic group in the molecule, and
   (b) 3 to 50% by mass of fine particles with a mean particle diameter of 0.1 to 3 μm;
   wherein
   the fine particles comprise mainly rutile type titanium dioxide fine particles;
   the polyester film is prepared by mixing the fine particles and the polyester resin in an extruder to provide a mixture, and then the mixture is extruded while degassing to obtain pellets of a fine particle-containing master batch, which are used to form the polyester film;
   the polyester film has a whiteness degree of 50 or higher;
   the polyester film has an acid value from not lower than 1 (eq/ton) and not higher than 30 (eq/ton);
   the breaking elongation retention of the polyester film is 60% or higher as measured in the standardized Highly Accelerated temperature and humidity Stress Test of JIS-60068-2-66 for 200 hours under conditions of 105° C., 100% RH, and 0.03 MPa;
   the breaking elongation retention of the polyester film is 35% or higher under UV irradiation at an irradiation intensity of 100 mW/cm² for 100 hours under conditions of 63° C. and 50% RH; and
   the polyester film has a half-life of breaking elongation retention of 700 hours or longer in a heat resistance test at 160° C.

2. The polyester film for the protection of a back surface of a solar cell according to claim 1, wherein the film has an apparent specific gravity from not lower than 0.7 and not higher than 1.3 by having a plurality of fine voids in the inside.

3. The polyester film for the protection of a back surface of a solar cell according to claim 1, wherein the film is composed of a polyester skin layer containing a large number of voids derived from the fine particles with a mean particle diameter of 0.1 to 3 μm and a polyester core layer containing a plurality of voids derived from a thermoplastic resin incompatible with the polyester.

4. The polyester film for the protection of a back surface of a solar cell according to claim 1, wherein the phosphorus compound is one or two or more compounds selected from the group consisting of phosphonic acid compounds and phosphinic acid compounds.

5. The polyester film for the protection of a back surface of a solar cell according to claim 1, wherein the phosphorus compound is one or two or more compounds selected from the group consisting of compounds represented by chemical formulas (1) and (2):

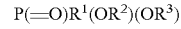     [Chemical formula 1]

$P(=O)R^1(OR^2)(OR^3)$

     [Chemical Formula 2]

$P(=O)R^1R^4(OR^2)$ wherein $R^1$ and $R^4$ each independently denote a $C_{1-50}$ hydrocarbon group containing an aromatic ring structure portion, or a $C_{1-50}$ hydrocarbon group containing an aromatic ring structure portion and a hydroxyl group, a halogen group, an alkoxyl group, or an amino group; and $R^2$ and $R^3$ each independently denote hydrogen, a $C_{1-50}$ hydrocarbon group, or a $C_{1-50}$ hydrocarbon group containing a hydroxyl group or an alkoxyl group;

wherein the hydrocarbon group for $R^2$ and $R^3$ optionally has an alicyclic structure or an aromatic ring structure.

6. The polyester film for the protection of a back surface of a solar cell according to claim 1, wherein the phosphorus compound has a phenolic portion in its molecule.

7. The polyester film for the protection of a back surface of a solar cell according to claim 6, wherein the phosphorus compound having a phenolic portion in its molecule is one or two or more compounds selected from the group consisting of compounds represented by chemical formulas (3) and (4):

$$P(=O)R^1(OR^2)(OR^3) \quad \text{[Chemical formula 3]}$$

$$P(=O)R^1R^4(OR^2) \quad \text{[Chemical Formula 4]}$$

wherein $R^1$ denotes a $C_{1-50}$ hydrocarbon group containing a phenolic portion, or a $C_{1-50}$ hydrocarbon group containing a phenolic portion and a hydroxyl group, a halogen group, an alkoxyl group, or an amino group; $R^4$ denotes hydrogen, a $C_{1-50}$ hydrocarbon group, or a $C_{1-50}$ hydrocarbon group containing a hydroxyl group, a halogen group, an alkoxyl group, or an amino group; $R^2$ and $R^3$ each independently denote hydrogen, a $C_{1-50}$ hydrocarbon group, or a $C_{1-50}$ hydrocarbon group containing a hydroxyl group or an alkoxyl group; the hydrocarbon group optionally has a branched structure, an alicyclic structure, or an aromatic ring structure; and the terminals of $R^2$ and $R^4$ optionally are bonded to each other.

8. A polyester film for the protection of a back surface of a solar cell containing
(a) a polyester, as a main constituent, obtained by polymerization using a polycondensation catalyst containing an aluminum salt of a phosphorus compound that includes an aromatic ring structure, and
(b) 3 to 50% by mass of fine particles with a mean particle diameter of 0.1 to 3 μm;
wherein
the fine particles comprise mainly rutile type titanium dioxide fine particles;
the polyester film is prepared by mixing the fine particles and the polyester resin in an extruder to provide a mixture, and then the mixture is extruded while degassing to obtain pellets of a fine particle-containing master batch, which are used to form the polyester film;
the polyester film has a whiteness degree of 50 or higher;
the polyester film has an acid value from not lower than 1 (eq/ton) and not higher than 30 (eq/ton);
the breaking elongation retention of the polyester film is 60% or higher as measured in the standardized Highly Accelerated temperature and humidity Stress Test of JIS-60068-2-66 for 200 hours under conditions of 105° C., 100% RH, and 0.03 MPa;
the breaking elongation retention of the polyester film is 35% or higher under UV irradiation at an irradiation intensity of 100 mW/cm² for 100 hours under conditions of 63° C. and 50% RH; and
the polyester film has a half-life of breaking elongation retention of 700 hours or longer in a heat resistance test at 160° C.

9. The polyester film for the protection of a back surface of a solar cell according to claim 8, wherein the film has an apparent specific gravity from not lower than 0.7 and not higher than 1.3 by having a plurality of fine voids in the inside.

10. The polyester film for the protection of a back surface of a solar cell according to claim 8, wherein the film is composed of a polyester skin layer containing a large number of voids derived from the fine particles with a mean particle diameter of 0.1 to 3 μm and a polyester core layer containing a plurality of voids derived from a thermoplastic resin incompatible with the polyester.

11. A polyester film for the protection of a back surface of a solar cell containing
(a) a polyester, as a main constituent, obtained by polymerization using a polycondensation catalyst containing at least one compound selected from compounds represented by chemical formula (5):

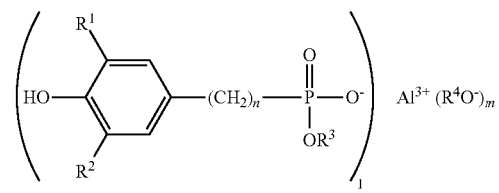

wherein $R^1$ and $R^2$ each independently denote hydrogen or a $C_{1-30}$ hydrocarbon group; $R^3$ denotes hydrogen, a $C_{1-50}$ hydrocarbon group, or a $C_{1-50}$ hydrocarbon group containing a hydroxyl group or an alkoxyl group; $R^4$ denotes hydrogen, a $C_{1-50}$ hydrocarbon group, or a $C_{1-50}$ hydrocarbon group containing a hydroxyl group, an alkoxyl group, or carbonyl; l is an integer of 1 or higher; m is 0 or an integer of 1 or higher; (l+m) is 3; n is an integer of 1 or higher; and the hydrocarbon group optionally has an alicyclic structure, a branched structure, or an aromatic ring structure; and
(b) 3 to 50% by mass of fine particles with a mean particle diameter of 0.1 to 3 μm;
wherein
the fine particles comprise mainly rutile type titanium dioxide fine particles;
the polyester film is prepared by mixing the fine particles and the polyester resin in an extruder to provide a mixture, and then the mixture is extruded while degassing to obtain pellets of a fine particle-containing master batch, which are used to form the polyester film;
the polyester film has a whiteness degree of 50 or higher;
the polyester film has an acid value from not lower than 1 (eq/ton) and not higher than 30 (eq/ton);
the breaking elongation retention of the polyester film is 60% or higher as measured in the standardized Highly Accelerated temperature and humidity Stress Test of JIS-60068-2-66 for 200 hours under conditions of 105° C., 100% RH, and 0.03 MPa;
the breaking elongation retention of the polyester film is 35% or higher under UV irradiation at an irradiation intensity of 100 mW/cm² for 100 hours under conditions of 63° C. and 50% RH; and
the polyester film has a half-life of breaking elongation retention of 700 hours or longer in a heat resistance test at 160° C.

12. The polyester film for the protection of a back surface of a solar cell according to claim 11, wherein the film has an apparent specific gravity from not lower than 0.7 and not higher than 1.3 by having a plurality of fine voids in the inside.

13. The polyester film for the protection of a back surface of a solar cell according to claim 11, wherein the film is composed of a polyester skin layer containing a large number of voids derived from the fine particles with a mean particle diameter of 0.1 to 3 μm and a polyester core layer containing a plurality of voids derived from a thermoplastic resin incompatible with the polyester.

\* \* \* \* \*